(12) United States Patent
Williams et al.

(10) Patent No.: US 6,786,994 B2
(45) Date of Patent: Sep. 7, 2004

(54) HEAT-SETTING LABEL SHEET

(75) Inventors: Scott A. Williams, Hawley, PA (US); Heather Reid, Hamburg, NJ (US)

(73) Assignee: Foto-Wear, Inc., Olyphant, PA (US)

(*) Notice: Subject to any disclaimer, the term of this patent is extended or adjusted under 35 U.S.C. 154(b) by 0 days.

(21) Appl. No.: 09/828,134

(22) Filed: Apr. 9, 2001

(65) Prior Publication Data

US 2001/0051265 A1 Dec. 13, 2001

Related U.S. Application Data

(63) Continuation-in-part of application No. 09/637,082, filed on Aug. 11, 2000.
(60) Provisional application No. 60/148,562, filed on Aug. 13, 1999.

(51) Int. Cl.[7] .................. B44C 1/165; B32B 31/20; B32B 22/00; B32B 22/30; B41M 3/12
(52) U.S. Cl. .................. 156/240; 156/230; 156/239; 156/247; 156/277; 156/289; 427/146; 427/147; 427/148; 428/42.1; 428/202; 428/343; 428/346; 428/348; 428/355 AC; 428/914
(58) Field of Search .................. 156/60, 63, 230, 156/239, 240, 241, 247, 277, 289, 272.2, 307.1; 427/146, 147, 148, 208.2; 428/46.1, 41.3, 41.5, 41.6, 41.18, 41.9, 42.2, 195, 200, 202, 207, 343, 346, 347, 348, 355 CN, 355 AC, 914

(56) References Cited

U.S. PATENT DOCUMENTS

| 1,799,754 A | | 4/1931 | Lawrence |
| 3,222,419 A | | 12/1965 | Jubilee et al. |
| 3,257,478 A | | 6/1966 | Jubilee et al. |
| 3,595,739 A | * | 7/1971 | Meyer .................. 161/229 |
| 3,790,439 A | * | 2/1974 | La Perre et al. .......... 161/167 |
| 3,920,016 A | | 11/1975 | Mesek et al. |
| 3,936,542 A | | 2/1976 | Cox .................. 427/288 |

(List continued on next page.)

FOREIGN PATENT DOCUMENTS

| DE | 4432383 C1 | 11/1995 |
| EP | 0 649 753 A1 | 4/1995 |

(List continued on next page.)

OTHER PUBLICATIONS

"Using Canon T–Shirt Transfers TR–101", 1995 Canon Computer Systems, Inc., form CST–4051–002.
English abstract of JP 59210978 (Nov. 29, 1984).
English abstract of JP 8324106 (Dec. 10, 1996).
English abstract of JP 55135853 (Oct. 23, 1980).
English abstract of JP 0948974 (Sep. 22, 1997).
English abstract of JP 2147291 (Jun. 06, 1990).

*Primary Examiner*—J. A. Lorengo
(74) *Attorney, Agent, or Firm*—Birch, Stewart, Kolasch & Birch, LLP

(57) ABSTRACT

The present invention relates to a heat-setting label sheet that is a polymeric transfer sheet that can be marked and transferred by the consumer. Also encompassed by the present invention is a method of transferring the heat-setting label sheets. The heat-setting label sheets of the present invention comprise a support; an optional pressure sensitive adhesive layer; an Adhesion Layer comprising a thermoplastic polymer which melts in the range of 50–250° C., a wax which melts in the range of 50–250° C., or combinations thereof; an optional opaque layer comprising a styrene-butadiene latex, thermoplastic polymer, elastomer, and optional pigment; and a second optional opaque layer comprising vinyl acetate-ethylene copolymer, thermoplastic elastomer, elastomer and optional pigment. The heat-setting label sheet of the present invention can be imaged by an electrostatic printer or copier, ink jet printer, offset or screen printing, craft-type marking, and the like.

60 Claims, 1 Drawing Sheet

U.S. PATENT DOCUMENTS

| | | | | |
|---|---|---|---|---|
| 3,959,555 | A | 5/1976 | Day et al. | 428/349 |
| 4,021,591 | A | 5/1977 | DeVries et al. | 428/200 |
| 4,064,285 | A | 12/1977 | Mammino | 427/24 |
| 4,104,816 | A | 8/1978 | Pingeton | 40/2 R |
| 4,218,294 | A | 8/1980 | Brack | |
| 4,224,358 | A | 9/1980 | Hare | 427/147 |
| 4,235,657 | A | 11/1980 | Greenman et al. | 156/234 |
| 4,284,456 | A | 8/1981 | Hare | 156/234 |
| 4,337,289 | A | 6/1982 | Reed et al. | 428/195 |
| 4,351,871 | A | 9/1982 | Lewis et al. | 428/195 |
| 4,477,622 | A | 10/1984 | Sanderson et al. | 521/522 |
| 4,555,436 | A | 11/1985 | Geurtsen et al. | 428/200 |
| 4,610,904 | A | 9/1986 | Mahn, Sr. et al. | 428/79 |
| 4,715,914 | A | 12/1987 | Viner | 156/94 |
| 4,726,979 | A | 2/1988 | Chapman | 428/200 |
| 4,763,931 | A | 8/1988 | Matsuguchi et al. | 203/108 |
| 4,773,953 | A | 9/1988 | Hare | 156/240 |
| 4,863,781 | A | 9/1989 | Kronzer | 428/200 |
| 4,869,957 | A | 9/1989 | Vankerckhoven et al. | 428/352 |
| 4,879,148 | A * | 11/1989 | Neaves et al. | 428/40 |
| 4,966,815 | A | 10/1990 | Hare | 428/497 |
| 4,980,224 | A * | 12/1990 | Hare | 156/240 |
| 5,019,475 | A | 5/1991 | Higashiyama et al. | 430/138 |
| 5,032,449 | A | 7/1991 | af Strom | 428/195 |
| 5,098,772 | A | 3/1992 | af Strom | 428/211 |
| 5,104,719 | A | 4/1992 | Kamen et al. | 428/195 |
| 5,139,917 | A | 8/1992 | Hare | 430/138 |
| 5,236,801 | A | 8/1993 | Hare | 430/199 |
| 5,242,739 | A | 9/1993 | Kronzer et al. | 428/200 |
| 5,242,781 | A | 9/1993 | Ohbayashi et al. | 428/203 |
| 5,271,990 | A | 12/1993 | Kronzer et al. | 428/145 |
| 5,366,837 | A | 11/1994 | Sakai | 430/97 |
| 5,407,729 | A | 4/1995 | Verden et al. | 428/196 |
| 5,419,944 | A | 5/1995 | Sammis | 428/147 |
| 5,424,141 | A | 6/1995 | Croner | 428/195 |
| 5,480,506 | A | 1/1996 | Mahn, Sr. et al. | 156/230 |
| 5,501,902 | A | 3/1996 | Kronzer | 428/323 |
| 5,514,435 | A | 5/1996 | Suzuki et al. | 428/40 |
| 5,603,996 | A | 2/1997 | Overcash et al. | 428/34.2 |
| 5,612,168 | A | 3/1997 | Ishikawa | 430/263 |
| 5,620,548 | A | 4/1997 | Hare | 156/239 |
| 5,665,476 | A | 9/1997 | Oez | 428/488.4 |
| 5,741,387 | A | 4/1998 | Coleman | 156/240 |
| 5,759,738 | A | 6/1998 | Tsuno et al. | 430/200 |
| 5,798,179 | A | 8/1998 | Kronzer | 428/411.1 |
| 5,882,388 | A | 3/1999 | Adair et al. | 106/31.6 |
| 5,925,712 | A | 7/1999 | Kronzer | |
| 5,932,352 | A * | 8/1999 | Higgins | 428/423.1 |
| 5,948,586 | A | 9/1999 | Hare | 430/138 |
| 6,033,824 | A | 3/2000 | Hare et al. | 430/263 |
| 6,083,656 | A | 7/2000 | Hare et al. | 430/256 |
| 6,087,061 | A | 7/2000 | Hare et al. | 430/256 |
| 6,096,475 | A | 8/2000 | Hare et al. | 430/263 |
| 6,099,944 | A | 8/2000 | Laprade et al. | |
| 6,241,841 | B1 | 6/2001 | Mahn, Sr. et al. | 156/200 |
| 6,410,200 | B1 | 6/2002 | Williams et al. | 430/126 |
| 6,423,466 | B2 | 7/2002 | Hare et al. | 430/263 |
| 6,383,710 | B2 | 5/2003 | Hare et al. | 430/251 |

FOREIGN PATENT DOCUMENTS

| | | |
|---|---|---|
| EP | 0820874 A1 | 1/1998 |
| EP | 0842787 A1 | 5/1998 |
| FR | 2442721 A1 | 6/1980 |
| FR | 2690873 A1 | 10/1983 |
| FR | 2452381 A1 | 11/1993 |
| GB | 1 216 613 | 12/1970 |
| GB | 2202641 A | 9/1988 |
| JP | 3018649 | 9/1995 |
| WO | WO 91/03766 A1 | 3/1991 |
| WO | WO 93/21561 A1 | 10/1993 |
| WO | WO 96/08367 A2 | 3/1996 |
| WO | WO 96/08367 | 3/1996 |
| WO | WO 97/18090 A1 | 5/1997 |
| WO | WO 98/20393 A1 | 5/1998 |
| WO | WO 98/21398 A1 | 5/1998 |

* cited by examiner

HEAT-SETTING LABEL SHEET

This application is a continuation-in-part of application Ser. No. 09/637,082 filed on Aug. 11, 2000, which is based on provisional Application No. 60/148,562 filed on Aug. 13, 1999, the entire contents of which are hereby incorporated by reference.

FIELD OF THE INVENTION

The present invention relates to a heat-setting label sheet and a method of transferring an image to a receptor element. More specifically, the present invention relates to a heat-setting label sheet which can be imaged, and having images which are capable of being directly transferred to, for instance, a receiver such as a textile, such as a shirt or the like.

BACKGROUND OF THE INVENTION

Textiles such as shirts (e.g., tee shirts) having a variety of designs thereon have become very popular in recent years. Many shirts are sold with pre-printed designs to suit the tastes of consumers. In addition, many customized tee shirt stores are now in the business of permitting customers to select designs or decals of their choice.

Transfer papers per se are known in the art in order to permit customers to create their own designs on transfer sheets for application to tee shirts by use of a conventional hand iron, such as described in U.S. Pat. No. 4,244,358 issued Sep. 23, 1980. Furthermore, U.S. Pat. No. 4,773,953 issued Sep. 27, 1988, is directed to a method for utilizing a personal computer, a video camera or the like to create graphics, images, or creative designs on a fabric.

U.S. Pat. No. 5,620,548 is directed to a silver halide photographic transfer element and to a method for transferring an image from the transfer element to a receptor surface. Provisional application No. 60/029,917 discloses that the silver halide light sensitive grains be dispersed within a carrier that functions as a transfer layer, and does not have a separate transfer layer. Provisional application No. 60/056,446 discloses that the silver halide transfer element has a separate transfer layer. Provisional Application No. 60/065,806 relates to a transfer element using CYCOLOR technology, and has a separate transfer layer. Provisional Application No. 60/065,804 relates to a transfer element using thermoautochrome technology, and has a separate transfer layer. Provisional application No. 60/030,933 relates to a transfer element using CYCOLOR and thermo-autochrome technology, but having no separate transfer layer. Provisional Application No. 60/127,625 by Williams et al., filed Apr. 1, 1999 is directed to a transfer sheet which, in one embodiment, is imagable by a laser copier or laser printer. U.S. application Ser. No. 09/791,755 discloses a peel-away transfer material.

U.S. Pat. No. 5,798,179 is directed to a printable heat transfer material using a thermoplastic polymer such as a hard acrylic polymer or poly(vinyl acetate) as a barrier layer, and has a separate film-forming binder layer.

U.S. Pat. No. 5,271,990 relates to an image-receptive heat transfer paper which includes an image-receptive melt-transfer film layer comprising a thermoplastic polymer overlaying the top surface of a base sheet.

U.S. Pat. No. 5,502,902 relates to a printable material comprising a thermoplastic polymer and a film-forming binder.

U.S. Pat. No. 5,614,345 relates to a paper for thermal image transfer to flat porous surfaces, which contains an ethylene copolymer or a ethylene copolymer mixture and a dye-receiving layer.

SUMMARY OF THE INVENTION

The present invention relates to a polymeric transfer sheet that can be marked and transferred by the consumer. The transfer sheet of the present invention comprise a base or support. The base may be, for example, a silicone coated release base. A lightly tacky pressure sensitive adhesive layer (PSA) is optionally coated onto the base. The PSA may be any polyester or acrylic polymer or copolymer blend or rubbery contact adhesive and preferably has a glass transition temperature (Tg) of less than zero degrees Centigrade. Coated onto the PSA is an Adhesion Layer that comprises a thermoplastic polymer which melts in the range of 50–250° C., a wax which melts in the range of 50–250°, or combinations thereof. Optionally one or more opaque layers and optionally one or more image receiving layers may be coated in turn over the Adhesion Layer. Said optional opaque layer(s) adds a rigid or stiff quality to the transfer sheet for ease of handling, as well as having opacity, especially white, to enhance visibility of the image when placed thereon. Said image receiving layer either does not melt when heat is applied or melts at a temperature above the melting temperature of the Adhesion Layer. Preferably, the image receiving layer does not melt below 260° C.

In another embodiment of the present invention, the above-described label sheet may comprise a barrier layer coated on said first surface of the support, said barrier layer comprising (1) a vinyl acetate with a Tg in the range of −10° C. to 100° C.; (2) a thermoplastic polymer having essentially no tack at transfer temperatures, a solubility parameter of at least 19 $(Mpa)^{1/2}$, and a glass transition temperature of at least 0° C., or (3) thermosetting polymers, ultraviolet curing polymers, or combinations thereof. If a barrier layer is used, the PSA may not be needed. That is, the barrier layer may perform the function of the PSA.

The present invention further relates to a process of transferring an image, which comprises imaging the above-described heat-setting label sheets (e.g., containing either a PSA, barrier layer, or both a PSA and barrier layer), peeling the adhesive layer and subsequent layers (such as, for example, heat transfer material or label material) from the base sheet (base material or support material), positioning the peeled portion of the label sheet onto the receptor element, and applying heat energy to the remaining layers of the heat transfer material with a household iron or a heat press. Heat is applied to the transfer element after peeling in order to melt the Adhesion Layer into the receptor element. However, the image receiving layer is not melted. As a result, a substantial single layer is formed which encapsulates the image (i.e., colorant) in a single layer. Therefore, peeling occurs in the absence of heat, water, chemicals or any other peeling aid.

The heat-setting label sheet of the present invention can be imaged upon using electronic means or craft-type marking. The electronic means may be, for example, electrostatic printers including but not limited to laser printers or laser copiers (color or monochromatic). In another embodiment, the invention may also be practiced with ink jet or thermal transfer printers. The present invention may also be practiced with offset printing (conventional printing) or screen printing. Further, the present invention may be practiced using craft-type markings such as, for example, markers, crayons, paints or pens.

When a laser printer or laser copier is used to image heat-setting label sheet of the present invention, the transfer label sheet of the present invention may optionally comprise an antistatic layer, which is coated on the backside of the base support or support (i.e., the side that was not previously coated with the Adhesion Layer, etc.).

DETAILED DESCRIPTION OF THE INVENTION

Figure 1:
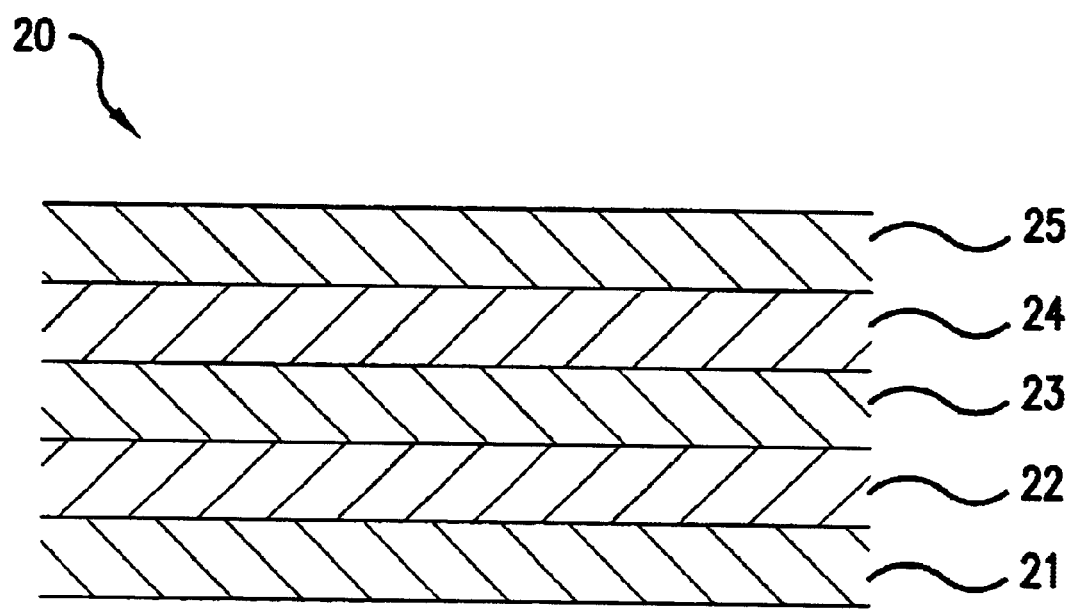
FIG. 1 represents an embodiment of the heat-setting label sheet of the present invention.

The present invention is a heat-setting label sheet, which comprises a support, a pressure-sensitive adhesive layer comprising a polyester or acrylic polymer or copolymer blends preferably with a glass transition temperature (Tg) of less than zero degrees Centigrade, an Adhesion Layer comprising a thermoplastic polymer which melts in the range of 50–250° C., a wax which melts in the range of 50–250° C., or combinations thereof, optionally one or more opaque layers, and optionally one or more image receiving layers.

The invention is based on the idea of a sheet of transferable polymers, imaged and transferred by the consumer. In one embodiment of the invention, the heat-setting label sheet closely resembles in appearance a sheet of AVERY brand labels. As discussed in greater detail below, the heat-setting label sheet of the present invention can be imaged in various ways including using an ink jet or laser printer, or various craft markers. One advantage of the present invention is that the heat-setting label sheets of the present invention are not imaged in reverse (i.e., printed as a mirror image of the transferred image), which is typical in the transferable media arts. That is, since the heat sealing element of the heatsetting label sheets of the present invention is peeled off the base sheet and placed on the receptor with the back of the image resting on the receptor (i.e., face up), the image does not need to be printed in reverse and placed face down on the receptor element. Since the heat-setting label sheets of the present invention do not need to be printed in reverse it is easier to use craft-type markers to image the heat-setting label sheet of the present invention than typical transfer sheets.

The heat-setting label sheets of the present invention retain ink, hold shape, and maintain strength. Specifically, the heat-setting label sheets of the present invention retain ink, hold shape, and maintain strength through multiple washings when the receptor element is a tee shirt or the like.

End uses for the heat-setting label sheet of the present invention include labels and designs for children's clothing, name labels and designs for book bags, tote bags, beach bags, and ID tracking numbers for dry cleaners use.

Embodiments of the present invention also addresses a problem with many known transfer sheets in that when conventional transfer materials travel through laser printers or copiers, the high temperature in the printers and copiers partially melts some polymer materials, such as a wax, present in the transfer material. As a result, the laser printer or copier must be frequently cleaned. The present invention solves this problem in the art. However, as described below, the present invention is not limited to use in laser printers and copiers.

The present invention also provides for a kit containing the heat setting label sheet of the present invention and instructions for transferring an image thereon. The kit may also optionally contain markers, paint, crayons, tee-shirts, prep-shirts and other design aids.

The present invention further provides for a greeting card containing the heat setting label sheet of the present invention. Greeting cards may be those described in, for example, copending U.S. provisional application No. 60/185,054, filed Feb. 25, 2000, herein incorporated by reference.

The Base Material

1. Support

Any nonwoven cellulosic support with or without an optional barrier layer may be used with the present invention. The support may also comprise a polyester film support. Most preferably, a silicone coated release base is used with the present invention.

The support preferably provides a surface that will promote or at least not adversely affect the peeling away of the layers coated thereon (e.g., heat sealing material) after imaging. An appropriate support may include but is not limited to a cellulosic nonwoven web or film, such as a smooth surface, heavyweight (approximately 24 lb.) laser printer or color copier paper stock or laser printer transparency (polyester) film. The particular support used is not known to be critical, so long as the support has sufficient strength for handling, copying, coating, peeling and other operations associated with the present invention. Accordingly, in accordance with some embodiments of the present invention, the support may be the base material for any printable material, such as described in U.S. Pat. No. 5,271,990 to Kronzer.

In accordance with other embodiments of the invention, the support must be usable in a laser copier or laser printer. A preferred support for this embodiment is equal to or less than approximately 4.0 mils thick.

Since this particular label sheet is useable in a laser copier or laser printer, antistatic agents may be present. The support has a front (first) surface and a back (second) surface. The antistatic agents may be present in the form of a coating on the back surface of the support as an additional layer. The back surface of the support is the surface that is not previously coated with the release layer, optional barrier layer, etc.

When the antistatic agent is applied as a coating onto the back surface of the support, the coating will help eliminate copier or printer jamming by preventing the electrostatic adhesion of the paper base to the copier drum of laser and electrostatic copiers and printers. Antistatic agents, or "antistats" are generally, but not necessarily, conductive polymers that promote the flow of charge away from the paper. Antistats can also be "humectants" that modulate the level of moisture in a paper coating that affects the build up of charge. Antistats are commonly charged tallow ammonium compounds and complexes, but also can be complexed organometallics. Antistats may also be charged polymers that have a similar charge polarity as the copier/printer drum; whereby the like charge repulsion helps prevent jamming.

Antistatic agents include, by way of illustration, derivatives of propylene glycol, ethylene oxide-propylene oxide block copolymers, organometallic complexes such as titanium dimethylacrylate oxyacetate, polyoxyethylene oxide-polyoxypropylene oxide copolymers and derivatives of cholic acid.

More specifically, commonly used antistats include those listed in the *Handbook of Paint and Coating Raw Materials*, such as t-Butylaminoethyl methacrylate; Capryl hydroxyethyl imidazoline; Cetethyl morpholinium ethosulfate; Cocoyl hydroxyethyl imidazoline Di(butyl, methyl pyrophosphato) ethylenetitanate di(dioctyl, hydrogen phosphite); Dicyclo (dioctyl)pyrophosphato; titanate; Di (dioctylphosphato) ethylene titanate; Dimethyl diallyl ammonium chloride; Distearyldimonium chloride; N,N'-Ethylene bis-ricinoleamide; Glyceryl mono/dioleate; Glyceryl oleate; Glyceryl stearate; Heptadecenyl hydroxyethyl imidazoline; Hexyl phosphate; N(β-Hydroxyethyl) ricinoleamide; N-(2-Hydroxypropyl) benzenesulfonamide; Isopropyl4-aminobenzenesulfonyl di(dodecylbenzenesulfonyl)titanate; Isopropyl dimethacryl isostearoyl titanate; isopropyltri(dioctylphosphato) titanate; Isopropyl tri(dioctylpyrophosphato)titanate; Isopropyl tri(N ethylaminoethylamino) titanate; (3-Lauramidopropyl) trimethyl ammonium methyl sulfate; Nonyl nonoxynol-15; Oleyl hydroxyethylimidazoline; Palmitic/stearic acid mono/diglycerides; PCA; PEG-36 castor oil; PEG-10 cocamine; PEG-2 laurate; PEG-2; tallowamine; PEG-5 tallowamine; PEG-15 tallowamine; PEG-20 tallowamine; Poloxamer 101; Poloxamer 108; Poloxamer 123; Poloxamer 124; Poloxamer 181; Poloxamer 182; Polaxamer 184; Poloxamer 185; Poloxamer 188; Poloxamer 217; Poloxamer 231; Poloxamer 234; Poloxamer 235; Poloxamer 237; Poloxamer 282; Poloxamer 288; Poloxamer 331; Polaxamer 333; Poloxamer 334; Poloxamer 335; Poloxamer 338; Poloxamer 401; Poloxamer 402; Poloxamer 403; Poloxamer 407; Poloxamine 304; Poloxamine 701; Poloxamine 704; Polaxamine 901; Poloxamine 904; Poloxamine 908; Poloxamine 1107; Poloxamine 1307; Polyamide/epichlorohydrin polymer; Polyglyceryl-10 tetraoleate; Propylene glycol laurate; Propylene glycol myristate; PVM/MA copolymer; polyether; Quaternium-18; Slearamidopropyl dimethyl-β-hydroxyethyl ammonium dihydrogen phosphate; Stearamidopropyl dimethyl-2-hydroxyethyl ammonium nitrate; Sulfated peanut oil; Tetra (2, diallyoxymethyl-1 butoxy titanium di (di-tridecyl) phosphite; Tetrahydroxypropyl ethylenediamine; Tetraisopropyl di (dioctylphosphito) titanate; Tetraoctyloxytitanium di (ditridecylphosphite); Titanium di (butyl, octyl pyrophosphate) di (dioctyl, hydrogen phosphite) oxyacetate; Titanium di (cumylphenylate) oxyacetate; Titanium di (dioctylpyrophosphate) oxyacetate; Titanium dimethacrylate oxyacetate.

Preferably, Marklear AFL-23 or Markstat AL-14, polyethers available from Whitco Industries, are used as an antistatic agents.

The antistatic coating may be applied on the back surface of the support by, for example, spreading a solution comprising an antistatic agent (i.e., with a metering rod) onto the back surface of the support and then drying the support.

2. The Optional Barrier Layer

The barrier layer is an optional first coating on the support. Furthermore, the heat-setting label sheet of the present invention may comprise more than one barrier layer coated onto the support. The barrier layer also assists in releasing the heat sealing material from the support. When the support performs the same function as the barrier layer, the barrier layer is not required. For example, when the support is a polyester film base, such as polyacetate, there will be minimal adherence to the support by the pressure sensitive adhesive layer and/or the heat sealing material. Accordingly, in those instances, a barrier layer may not be required.

Thus, the barrier layer is a coating that separates the support from the remaining layers of the heat-setting label sheet. The barrier layer, when necessary, is between the support and the remaining layers. After peeling, the barrier layer preferably remains with the support.

The barrier layer(s) of the present invention may be one of the barrier layers discussed in Provisional Application No. 60/127,625. Preferably, the barrier layer is any vinyl acetate with a Tg in the range of from −10° C. to 100° C. Alternatively, the Tg may be in the range of from 0° C. to 100° C. EVERFLEX G. with a Tg of about −7°, may be used as a preferred embodiment.

Other examples of a suitable barrier layer(s) of the present invention may be the release layer of U.S. Pat. No. 5,798,179 to Kronzer. The barrier layer may be composed of a thermoplastic polymer having essentially no tack at transfer temperatures (e.g., 177° C.), a solubility parameter of at least about 19 $(Mpa)^{1/2}$, and a glass transition temperature of at least about 0° C. As used herein, the phrase "having essentially no tack at transfer temperatures" means that the barrier layer does not stick to the Release Layer to an extent sufficient to adversely affect the quality of the transferred image. By way of illustration, the thermoplastic polymer may be a hard acrylic polymer or poly(vinyl acetate). For example, the thermoplastic polymer may have a glass transition temperature ($T_g$) of at least about 25° C. As another example, the $T_g$ may be in a range of from about 25° C. to about 100° C. The barrier layer also may include an effective amount of a release-enhancing additive, such as a divalent metal ion salt of a fatty acid, a polyethylene glycol, or a mixture thereof. For example, the release-enhancing additive may be calcium stearate, a polyethylene glycol having a molecular weight of from about 2,000 to about 100,000, or a mixture thereof.

In one embodiment of the invention, Barrier Layer Formulation 1, the barrier layer comprises a vinyl acetate polymer.

Barrier Layer Formulation 1 may be prepared as described in Provisional application No. 60/127,625.

In another embodiment of the present invention, the barrier layer contains a polyester resin such as polymethyl methacrylate (PMMA) in a molecular weight range of from 15,000 to 120,000 Daltons.

Barrier Layer Formulation 2 may be prepared as described in Provisional application No. 60/127,625.

Furthermore, the barrier layer(s) of the present invention may comprise the thermosetting polymers, ultraviolet curing polymers, or combinations thereof as described in Provisional application No. 60/133,861.

3. Pressure Sensitive Adhesive Layer

The pressure sensitive adhesive layer (PSA) allows the layers of the heat-setting label sheet to be easily separated by peeling from the support. If an above-described barrier layer accomplishes this task, the pressure sensitive adhesive layer may be optional.

Generally, the pressure sensitive adhesive layer remains with the support, along with the barrier layer. However, any portion of the pressure sensitive adhesive layer that is peeled away with the remaining layers of the label helps to provide stickiness used to adhere the label to the receptor. That is, the pressure sensitive adhesive layer allows the label to be laid onto the receptor and repositioned multiple times with a slight tack. However, the PSA layer does not provide for permanent adhesion to the receptor.

Any polyester or acrylic polymer or copolymer blends may be used when the glass transition temperature (Tg) of the polyester, acrylic polymer or copolymer blend is less than zero degrees Centigrade. Preferably, the Tg will fall between −15° C. and −70° C. and display a slight tack when touched.

A preferred example of the pressure sensitive adhesive layer, Pressure Sensitive Adhesive Layer Formulation 1, is comprised of an acrylic polymer adhesive.

Preferably, the PSA has a thickness of about 0.4 mils (wet).

When the optional PSA layer is not used, the surface energy difference between the selected barrier layer and the Adhesion Layer, described below, must be between about 0 to about 50 dynes/cm, preferably about 0 to about 30 dynes/cm, most preferably about 0 to about 15 dynes/cm. The Heat Sealing Material 4. The Adhesion Layer The first layer that comprises the heat sealing material (i.e., label portion) that is peeled away from the support is the Adhesion Layer. The Adhesion Layer melts and flows upon application of heat and pressure, such as the heat and pressure applied from a household iron or heat press, binding the image to the receptor element. The adhesive layer gives the label the majority of its strength characteristics. The Adhesion Layer may optionally comprise pigments to help give an opaque background to aid in ink visibility on various colored receptors.

The Adhesion Layer comprises polymers and/or waxes which melts within a temperature range from 50–250° C., preferably 65–220° C., more preferably 70–180° C. The Adhesion Layer forms a film on the top surface of the pressure sensitive adhesive layer. The Adhesion Layer may comprise wax, thermoplastic polymers, or any combination thereof. The preferred binder chemical of the Adhesion Layer is an ethylene acrylic acid copolymer, yet other suitable binders include, but are not limited to, acrylic/styrene; Ceteareth-18; Ceteareth-80; Cetyl palmitate; Coumarone-indene resin, Ethylene/vinyl chloride copolymer; Ethyl hydroxyethyl cellulose; Ethyl polysilicate, Meroxapol 105; Meroxapol 171; Maroxapol 172; Meroxapol 174; Meroxapol 252; Meroxapol 254; Meroxapol 258; Meroxapol 311; Methyl hydroxyethylcellulose; Phenylmethyl polysiloxane; Polyacrylamide; Polybutene; Polyvinyl alcohol, partially hydrolyzed; Polyvinyl methyl ether; Potassium silicate; PVM/MA copolymer, butyl ester; PVM/MA copolymer, ethyl ester, Sodium bentonite; Styrene/acrylates copolymer, Styrene-butadiene rubber; Styrene/MA copolymer; Styrene/PVP copolymer, Vinyl acetate/ethylene copolymer; Vinyl acetate/ethylene/vinyl chloride terpolymer; Vinyl actetate/vinyl laurate/vinyl chloride terpolymer; Vinyl acrylic copolymer; Vinyl chloride/vinyl acetate copolymer; Vinyl chloride/vinyl acetate/ethylene terpolymer; vinylidene chloride copolymer.

Other suitable binders include those listed in U.S. Pat. No. 5,798,179, in addition to polyolefins, polyesters, ethylene-vinyl acetate, copolymers, and ethylene-methacrylate acid copolymers. Waxes, categorized as natural waxes, include vegetable waxes such as carnuba wax, candelilla wax, rice wax and haze wax; mineral waxes such as ceresine wax, montan wax and derivatives of these; and petroleum waxes such as paraffin wax, and microcrystalline wax. Further, synthetic waxes can be used, which include polyethylene wax, oxidized polyethylene wax, and Fisher-Tropsch wax.

Suitable coating weight is about 3.0 mils (wet).

The heat sealing material of the invention may comprise several layers if desired. Chemically, the Adhesion Layer of the invention corresponds to virtually all known release layers in the art of transferring images to t-shirts. Preferred are the release layers disclosed by Kimberly Clark Corporation, of Georgia, and Foto-Wear, Inc. of Milford, Pa.

For instance, the release layer of U.S. Provisional Application No. 60/127,625 may be used as the Adhesion Layer of the present invention. In such an embodiment, the Adhesion Layer may be prepared from, for example, a coating composition comprising an acrylic dispersion, an elastomeric emulsion, a plasticizer, and a water repellent. The water repellent may comprise, for example, polyurethane for the purpose of providing water resistance for toner retention and/or a retention aid.

The Adhesion Layer of the present invention protects any image, provides mechanical and thermal stability, as well as washability, preferably without losing the flexibility of a textile, for example. That is, the Adhesion Layer should also provide a colorfast image (e.g. washproof or wash resistant). Thus, upon washing the receptor element (e.g. tee shirt), the image should remain intact.

Further, the Adhesion Layer satisfies the requirement for compatible components, in that the component dispersions remain in their finely dispersed state after admixture, without coagulating or forming clumps or aggregated particles which would adversely affect image quality. Additionally, the Adhesion Layer is preferably non-yellowing.

The Adhesion Layer has a low content of organic solvents, and any small amounts present during the coating process are sufficiently low as to meet environmental and health requirements. More specifically, the Adhesion Layer preferably has a content of organic solvents of less than 2% weight by weight of components. More preferably, the Adhesion Layer has a content of organic solvents of less than 1% weight by weight of components.

Various additives may be incorporated into the Adhesion Layer and/or the image receiving layer(s) discussed. Retention aids, wetting agents, plasticizers and water repellents are examples. Each will be discussed in turn, below.

Retention Aids

An additive may be incorporated for the purpose of aiding in the binding of the applied colorant such as water-based ink jet colorants and/or dry or liquid toner formulations. Such additives are generally referred to as retention aids. Retention aids that have been found to bind colorants generally fall into three classes: silicas, latex polymer and polymer retention aids. Silicas and silicates are employed when the colorant is water-based such as ink jet formulations. An example of widely used silicas are the Ludox (DuPont) brands. Polyvinyl alcohol represents as class of polymers that have also been applied to the binding of ink jet dyes. Other polymers used include anionic polymers such as Hercobond 2000 (Hercules). Reten 204LS (Hercules) and Kymene 736 (Hercules) are catonic amine polymer-epichlorohydrin adducts used as retention aids. Latex polymers include, by way of illustration, vinyl polymers and vinyl co-polymer blends such as ethylene-vinyl acetate, styrene-butadiene copolymers, polyacrylate and other polyacrylate-vinyl copolymer blends. The retention aids are present in an amount of from 0.1 to 40% by weight, preferably 0.1 to 20%, more preferably from 0.1 to 10%.

Wetting Agents and Rheology Modifiers

Wetting agents, rheology modifiers and surfactants may also be included in the Adhesion Layer. Such agents may either be nonionic, cationic or anionic. The surfactant selected should be compatible with the class of polymers used in a formulation. For example, anionic polymers require the use of anionic or non-ionic wetting agents or surfactants. Likewise, cationic surfactants are stable in polymer solutions containing cationic or non-ionic polymers. Examples of surfactants or wetting agents include, by way of illustration, alkylammonium salts of polycarboxylic acid, salts of unsaturated polyamine amides, derivatives of nonoxynol, derivatives of octoxynols (Triton X-100 and Triton X-114 (Union Carbide), for example), dimethicone copolymers, silicone glycol copolymers, polysiloxane-polyether copolymers, alkyl polyoxy carboxylates, fluoropolymers, tall oil fatting acids, ethylene oxide-propylene oxide block copolymers and derivatives of polyethylene glycol. The wetting agents are present in an amount of from 0.1 to 40% by weight, preferably 0.1 to 20%, more preferably from 0.1 to 10%.

Viscosity modifiers may also be included. Generally, various molecular weight polyethylene glycols are incorporated to serve this purpose. Polyethylene glycols used generally range in molecular weight from 100 to 500,000 with molecular weights between 200 and 1000 being the most useful in this application.

Plasticizers

Plasticizers may be included in order to soften hard polymer and polymer blend additions. Plasticizers used include, by way of illustration, aromatic derivatives such as di-octyl phthalate, di-decyl phthalate derivatives and tri-2-ethylhexyl trimellitate. Aliphatic plasticizers include derivatives of ethylhexyl adipates and ethylhexyl sebacates. Epoxidized linseed or soya oils may also be incorporated but generally are not used due to yellowing and chemical instability upon heat application. The plasticizers are present in an amount of from 0.1 to 40% by weight, preferably 0.1 to 20%, more preferably from 0.1 to 10%.

Water Repellants

Water repellent aids may also be incorporated into order to improve the wash/wear resistance of the image. Examples of additives include polyurethanes, wax dispersions such as carnauba wax, mineral waxes, montan wax, derivatives of montan wax, petroleum waxes, synthetic waxes such as polyethylene and oxidized polyethylene waxes, hydrocarbon resins, amorphous fluoropolymers and polysiloxane derivatives. The water repellents are present in an amount of from 0.1 to 40% by weight, preferably 0.1 to 20%, more preferably from 0.1 to 10%.

When the imaging method is a laser printer or copier, the Adhesion Layer of the present invention preferably excludes wax dispersions derived from, for example, a group including but not limited to natural waxes such as carnauba wax, mineral waxes, montan wax, derivatives of montan wax, petroleum waxes, and synthetic waxes such as polyethylene and oxidized polyethylene waxes. If the imaging method is used in a nonlaser printer/copier method, waxes are not excluded from use in the material. However, the amount of waxes that may be present in the material of the invention when intended for use in laser printers or copiers must be sufficiently low as to avoid adverse affects on copier or printer operation. That is, the amount of wax present must not cause melting in the printer or copier.

The above properties make this particular embodiment of the Adhesion Layer highly suited for compatibilizing the stringent requirements of the electrostatic imaging process with the requirements of heat image technology to provide a product having good image quality and permanence under the demanding conditions of textile application, wear and wash resistance in use, and adhesion to wash resistance on decorated articles.

Additional suitable examples of the Adhesion Layers of the invention are exemplified below.

In one embodiment of the invention, the Adhesion Layer comprises an ethylene acrylic acid co-polymer dispersion, an elastomeric emulsion, a polyurethane dispersion, and polyethylene glycol. An example of this embodiment is Adhesion Layer Formulation 1.

The acrylic dispersion is present in a sufficient amount so as to provide adhesion of the Adhesion Layer and image to the receptor element and is preferably present in an amount of from 46 to 90 weight %, more preferably 70 to 90 weight % based on the total composition of the Adhesion Layer.

The elastomeric emulsion provides the elastomeric properties such as mechanical stability, flexibility and stretchability, and is preferably present in an amount of from 1 to 45 weight %, more preferably 1 to 20 weight % based on the total composition of the Adhesion Layer.

The water repellent provides water resistance and repellency, which enhances the wear resistance and washability of the image on the receptor, and is preferably present in an amount of from 1 to 7 weight %, more preferably 3 to 6 weight % based on the total composition of the Adhesion Layer.

The plasticizer provides plasticity and antistatic properties to the transferred image, and is preferably present in an amount of from 1 to 8 weight %, more preferably 2 to 7 weight % based on the total composition of the Adhesion Layer.

Preferably, the acrylic dispersion is an ethylene acrylic acid co-polymer dispersion that is a film-forming binder that provides the "release" or "separation" from the support. The Adhesion Layer of the invention may utilize the film-forming binders of the image-receptive melt-transfer film layer of U.S. Pat. No. 5,242,739, which is herein incorporated by reference.

Thus, the nature of the film-forming binder is not known to be critical. That is, any film-forming binder can be employed so long as it meets the criteria specified herein. As a practical matter, water-dispersible ethylene-acrylic acid copolymers have been found to be especially effective film forming binders.

The term "melts" and variations thereof are used herein only in a qualitative sense and are not meant to refer to any particular test procedure. Reference herein to a melting temperature or range is meant only to indicate an approximate temperature or range at which a polymer or binder melts and flows under the conditions of a melt-transfer process to result in a substantially smooth film.

Manufacturers' published data regarding the melt behavior of polymers or binders correlate with the melting requirements described herein. It should be noted, however, that either a true melting point or a softening point may be given, depending on the nature of the material. For example, materials such as polyolefins and waxes, being composed mainly of linear polymeric molecules, generally melt over a relatively narrow temperature range since they are somewhat crystalline below the melting point.

Melting points, if not provided by the manufacturer, are readily determined by known methods such as differential scanning calorimetry. Many polymers, and especially copolymers, are amorphous because of branching in the polymer chains or the side-chain constituents. These materials begin to soften and flow more gradually as the temperature is increased. It is believed that the ring and ball softening point of such materials, as determined by ASTM E-28, is useful in predicting their behavior. Moreover, the melting points or softening points described are better indicators of performance than the chemical nature of the polymer or binder.

Representative binders (i.e., acrylic dispersions) for release from the support are as follows:

Binder A

Binder A is Michem® 58035, supplied by Michelman, Inc., Cincinnati, Ohio. This is a 35 percent solids dispersion of Allied Chemical's AC 580, which is approximately 10 percent acrylic acid and 90 percent ethylene. The polymer reportedly has a softening point of 102° C. and a Brookfield viscosity of 0.65 pas (650 centipoise) at 140° C.

Binder B

This binder is Michem® Prime 4983R (Michelman, Inc., Cincinnati, Ohio). The binder is a 25 percent solids dispersion of Primacor® 5983 made by Dow Chemical Company. The polymer contains 20 percent acrylic acid and 80 percent ethylene. The copolymer has a Vicat softening point of 43° C. and a ring and ball softening point of 100° C. The melt index of the copolymer is 500 g/10 minutes (determined in accordance with ASTM D-1238).

Binder C

Binder C is Michem® 4990 (Michelman, Inc., Cincinnati, Ohio). The material is 35 percent solids dispersion of Primacor® 5990 made by Dow Chemical Company. Primacor® 5990 is a copolymer of 20 percent acrylic acid and 80 percent ethylene. It is similar to Primacor® 5983 (see Binder B), except that the ring and ball softening point is 93° C. The copolymer has a melt index of 1,300 g/10 minutes and Vicat softening point of 39° C.

Binder D

This binder is Michem® 37140, a 40 percent solids dispersion of a Hoechst-Celanese high density polyethylene. The polymer is reported to have a melting point of 100° C.

Binder E

This binder is Michem® 32535 which is an emulsion of Allied Chemical Company's AC-325, a high density polyethylene. The melting point of the polymer is about 138° C. Michem® 32535 is supplied by Michelman, Inc., Cincinnati, Ohio.

Binder F

Binder F is Michem® 48040, an emulsion of an Eastman Chemical Company microcrystalline wax having a melting point of 88° C. The supplier is Michelman, Inc., Cincinnati, Ohio.

Binder G

Binder G is Michem® 73635M, an emulsion of an oxidized ethylene-based polymer. The melting point of the polymer is about 96° C. The hardness is about 4–6 Shore-D. The material is supplied by Michelman Inc., Cincinnati, Ohio.

The second component of Adhesion Layer Formulation 1 is an elastomeric emulsion, preferably a latex, and is compatible with the other components, and formulated to provide durability, mechanical stability, and a degree of softness and conformability to the layers.

Films of this material must have moisture resistance, low tack, durability, flexibility and softness, but with relative toughness and tensile strength. Further, the material should have inherent heat and light stability. The latex can be heat sensitized, and the elastomer can be self-crosslinking or used with compatible cross-linking agents, or both. The latex should be sprayable, or roll stable for continuous runnability on nip rollers.

Elastomeric latexes of the preferred type are produced from the materials and processes set forth in U.S. Pat. Nos. 4,956,434 and 5,143,971, which are herein incorporated by reference. This curable latex is derived from a major amount of acrylate monomers such as $C_4$ to $C_8$ alkyl acrylate, preferably n-butyl acrylate, up to about 20 parts per hundred of total monomers of a monolefinically unsaturated dicarboxylic acid, most preferably itaconic acid, a small amount of crosslinking agent, preferably N methyl acrylamide, and optionally another monolefinic monomer.

Using a modified semibatch process in which preferably the itaconic acid is fully charged initially to the reactor with the remaining monomers added over time, a latex of unique polymer architecture or morphology is created, leading to the unique rubbery properties of the cured films produced therefrom.

The third ingredient of Adhesion Layer Formulation 1 is a water resistant aid such as a polyurethane dispersion which provides a self-crosslinking solvent and emulsifier-free aqueous dispersion of an aliphatic urethane-acrylic hybrid polymer which, alone, produces a clear, crack-free film on drying having very good scratch, abrasion and chemical resistance. This ingredient is also a softener for the acrylic dispersion and plasticizer aid.

Such product may be produced by polymerizing one or more acrylate and other ethylenic monomers in the presence of an oligourethane to prepare oligourethane acrylate copolymers. The oligourethane is preferably prepared from dials and diisocyanates, the aliphatic or alicyclic based diisocyanates being preferred, with lesser amounts, if any, of aromatic diisocyanates, to avoid components which contribute to yellowing. Polymerizable monomers, in addition to the usual acrylate and methacrylate esters of aliphatic monoalcohols and styrene, further include monomers with carboxyl groups, such as acrylic acid or methacrylic acid, and those with other hydrophylic groups such as the hydroxyalkyl acrylates (hydroxyethyl methacrylate being exemplary). The hydrophylic groups in these monomers render the copolymer product dispersible in water with the aid of a neutralizing agent for the carboxyl groups, such as dimethylethanolamine, used in amount to at least partially neutralize the carboxyl groups after dispersion in water and vacuum distillation to remove any solvents used to prepare the urethane acrylic hybrid. Further formulations may include the addition of crosslinking components such as amino resins or blocked polyisocyanates. Although pigments and fillers could be added to any of the coating layers, such use to uniformly tint or color the coated paper could be used for special effect, but would not be used where an image is desired in the absence of background coloration. Urethane acrylic hybrid polymers are further described in U.S. Pat. No. 5,708,072, and their description in this application is incorporated by reference.

Self crosslinking acrylic polyurethane hybrid compositions can also be prepared by the processes and materials of U.S. Pat. No. 5,691,425, herein incorporated by reference. These are prepared by producing polyurethane macromonomers containing acid groups and lateral vinyl groups, optionally terminal vinyl groups, and hydroxyl, urethane, thiourethane and/or urea groups. Polymerization of these macromonomers produces acrylic polyurethane hybrids which can be dispersed in water and combined with crosslinking agents for solventfree coating compositions.

Autocrosslinkable polyurethane-vinyl polymers are discussed in detail in U.S. Pat. Nos. 5,623,016 and 5,571,861, and their disclosure of these materials is incorporated by reference. The products usually are polyurethane-acrylic hybrids, but with self-crosslinking functions. These may be carboxylic acid containing, neutralized with, e.g. tertiary amines such as ethanolamine, and form useful adhesives and coatings from aqueous dispersion.

The elastomeric emulsion and polyurethane dispersion are, generally, thermoplastic elastomers. Thermoplastic elastomeric polymers are polymer blends and alloys which have both the properties of thermoplastic polymers, such as having melt flow and flow characteristics, and elastomers, which are typically polymers which cannot melt and flow due to covalent chemical crosslinking (vulcanization). Thermoplastic elastomers are generally synthesized using two or more monomers that are incompatible; for example, styrene and butadiene. By building long runs of polybutadiene with intermittent polystyrene runs, microdomains are established which imparts the elastomeric quality to the polymer system. However, since the microdomains are established through physical crosslinking mechanisms, they can be broken by application of added energy, such as heat from a hand iron, and caused to melt and flow; and therefore, are elastomers with thermoplastic quality.

Thermoplastic elastomers have been incorporated into the present invention in order to provide the image system with elastomeric quality. Two thermoplastic elastomer systems have been introduced; that is, a polyacrylate terpolymer elastomer (for example, Hystretch V-29) and an aliphatic urethane acryl hybrid (for example, Daotan VTW 1265). Thermoplastic elastomers can be chosen from a group that includes, for example, ether-ester, olefinic, polyether, polyester and styrenic thermoplastic polymer systems. Specific examples include, by way of illustration, thermoplastic elastomers such as polybutadiene, polybutadiene derivatives, polyurethane, polyurethane derivatives, styrene-butadiene, styrenebutadiene-styrene, acrylonitrile-butadiene, acrylonitrilebutadiene-styrene, acrylonitrile-ethylene-styrene, polyacrylates, polychloroprene, ethylene-vinyl acetate and poly (vinyl chloride). Generally, thermoplastic elastomers can be selected from a group having a glass transition temperature (Tg) ranging from about −50° C. to about 25° C.

The fourth component of Adhesion Layer Formulation 1 is a plasticizer such as a polyethylene glycol dispersion which provides mechanical stability, water repellency, and allows for a uniform, crack-free film. Accordingly, a reason to add the polyethylene glycol dispersion is an aid in the coating process. Further, the polyethylene glycol dispersion acts as a softening agent. A preferred fourth component is Carbowax Polyethylene Glycol 400, available from Union Carbide.

An optional fifth ingredient of Adhesion Layer Formulation 1 is a surfactant and wetting agent such as polyethylene glycol mono ((tetramethylbutyl) phenol) ether.

Adhesion Layer Formulation 1, as a preferred embodiment of the invention when the imaging is performed by laser copiers and laser printers, is wax free.

In another embodiment of the invention, the Adhesion Layer comprises an acrylic binder and a wax emulsion. The Adhesion Layer may further contain a retention aid such as Hercobond 2000®. The retention aid provides water resistance, which enhances the washability of the image on the support. An example of this embodiment may be found in Adhesion Layer Formulation 2.

Alternatively, the binders suitable for Adhesion Layer Formulation 1 may be used in lieu of the above-described ethylene acrylic acid copolymer dispersion.

Formulation 2 works in a laser printer or copier despite the presence of wax since the wax is present in sufficiently low amounts so as to not adversely affect imaging such as, for example, by melting within the printer or copier (i.e., at most about 25 parts (weight)).

Another embodiment of the Adhesion Layers of the present invention include compositions comprising materials from U.S. Pat. Nos. 5,501,902, 5,271,990 and 5,242,739. The contents of U.S. Pat. Nos. 5,501,902, 5,271,990 and 5,242,739 are herein incorporated by reference. These patents are discussed in turn hereinbelow.

The Adhesion Layer of this embodiment may utilize the materials of the second layer of U.S. Pat. No. 5,501,902.

This embodiment preferably includes particles of a thermoplastic polymer having largest dimensions of less than about 50 micrometers, and preferably from about 1 to about 20 micrometers. The particles will more preferably have dimensions of from about 2 to about 10 micrometers. In general, the thermoplastic polymer can be any thermoplastic polymer which meets the criteria set forth herein. Desirably, the powdered thermoplastic polymer will be selected from the group consisting of polyolefins, polyesters, and ethylene-vinyl acetate copolymers.

The Adhesion Layer of this embodiment also includes from about 10 to about 50 weight percent of a film-forming binder, based on the weight of the thermoplastic polymer. Desirably, the amount of binder will be from about 10 to about 30 weight percent. In general, any film-forming binder may be employed which meets the criteria set forth herein. When the Adhesion Layer includes a cationic polymer, a nonionic or cationic dispersion or solution may be employed as the binder. Suitable binders include polyacrylates, polyethylenes, and ethylenevinyl acetate copolymers. The latter are particularly desired because of their stability in the presence of cationic polymers. The binder desirably will be heat softenable at temperatures of about 120° Celsius or lower.

This embodiment of the Adhesion Layer desirably also will contain from about 2 to about 20 weight percent of a cationic polymer, based on the weight of the thermoplastic polymer. The cationic polymer may be, for example, an amide-epichlorohydrin polymer, polyacrylamides with cationic functional groups, polyethyleneimines, polydiallylamines, and the like. When a cationic polymer is present, a compatible binder should be selected. The binder desirably will be a nonionic binder, either in the form of a solution or a nonionic or cationic dispersion or emulsion. As is well known in the paper coating art, many commercially available binders have anionically charged particles or polymer molecules. These materials are generally not compatible with the cationic polymer which may be used in the present invention.

One or more other components may be used with this embodiment of the Adhesion Layer. For example, the Adhesion Layer may contain from about 1 to about 20 weight percent of a humectant, based on the weight of the thermoplastic polymer. Desirably, the humectant will be selected from the group consisting of ethylene glycol and poly (ethylene glycol). The poly(ethylene glycol) typically will have a weight average molecular weight of from about 100 to about 40,000. A poly(ethylene glycol) having a weight-average molecular weight of from about 200 to about 800 is particularly useful.

The Adhesion Layer also may contain from about 0.2 to about 10 weight percent of a fluid (e.g. ink) viscosity modifier, based on the weight of the thermoplastic polymer. The viscosity modifier desirably will be a poly(ethylene glycol) having a weight-average molecular weight of from about 100,000 to about 2,000,000. The poly(ethylene glycol) desirably will have a weight-average molecular weight of from about 100,000 to about 600,000.

Other components which may be present in the Adhesion Layer include from about 0.1 to about 5 weight percent of a weak acid and from about 0.5 to about 5 weight percent of a surfactant, both based on the weight of the thermoplastic polymer. A particularly useful weak acid is citric acid. The term "weak acid" is used herein to mean an acid having a dissociation constant less than one (or a negative log of the dissociation constant greater than 1).

The surfactant may be an anionic, a nonionic, or a cationic surfactant. When a cationic polymer is present in the Adhesion Layer, the surfactant should not be an anionic surfactant.

Desirably, the surfactant will be a nonionic or cationic surfactant. However, in the absence of the cationic polymer, an anionic surfactant may be used, if desired. Examples of anionic surfactants include, among others, linear and branched-chain sodium alkylbenzenesulfonates, linear and branched-chain alkyl sulfates, and linear and branched-chain alkyl ethoxy sulfates. Cationic surfactant include, by way of illustration, tallow trimethylammonium chloride. Examples of nonionic surfactants, include, again by way of illustration only, alkyl polyethoxylates, polyethoxylated alkylphenols, fatty acid ethanol amides, complex polymers of ethylene oxide, propylene oxide, and alcohols, and polysiloxane polyethers. More desirably, the surfactant will be a nonionic surfactant.

The Adhesion Layer may also utilize the materials from a melt-Adhesion Layer of the '902 patent. Such a melt-transfer film layer typically comprises a film forming binder, as already described, or other polymer. The layer desirably is applied by extrusion coating, but other methods also may be used. The Adhesion Layer desirably is formed from a polyethylene or a copolymer of ethylene with acrylic acid, methacrylic acid, vinyl acetate, or acrylic acid esters such as ethyl acrylate. The polymer desirably will have a melt flow rate of at least about 30 grams per 10 minutes (g/10 minutes), as determined in accordance with ASTM Method D-1238, although the melt flow rate may be as high as about 4,000 g/10 minutes. More desirably, the melt flow rate of the polymer will be from about 300 to about 700 g/10 minutes. The basis weight of the melt-transfer film layer desirably will be from about 5 to about 30 grams per square meter (g/m$^2$).

The Adhesion Layer of the invention may also correspond to the release layer of the '902 patent, which desirably will be a low molecular weight ethylene-acrylic acid copolymer applied from an aqueous dispersion. The melt flow rate of the ethylene acrylic acid copolymer desirably will be at least about 200 g/10 minutes, more desirably from about 800 to about 1,200 g/10 minutes. Such dispersion also may contain a paraffin wax, which is mixed as an emulsion with the ethylene-acrylic acid copolymer dispersion. The paraffin wax emulsion can be any of those which are commercially available, such as Chemwax® 40 (Chematron, Inc., Charlotte, N.C.). The ratio of paraffin wax to the copolymer may vary from 0 to about 4, with a ratio of about 1 to about 3 being more desirable. The basis weight of the adhesion layer desirably will be from about 5 to about 30 g/m$^2$. The basis weight of the adhesion layer may also desirably be from about 5 to about 100 g/m$^2$.

Accordingly, the Adhesion Layer of the invention may comprise particles of a thermoplastic polymer preferably having largest dimensions of less than about 50 micrometers, preferably from about 1 to about 20 micrometers, and more preferably from about 2 to about 10 micrometers, from about 10 to about 50 weight percent of a film-forming binder, based on the weight of the thermoplastic polymer, and from about 0.2 to about 10 weight percent of a viscosity modifier, based on the weight of the thermoplastic polymer.

The Adhesion Layer has a melting point of more than 65° C., preferably more than 100° C. and more preferably from about 100 to about 180 degrees Celsius. The Adhesion Layer may also contain from about 2 to about 20 weight percent of a cationic polymer, based on the weight of the thermoplastic polymer. The Adhesion Layer may also contain from about 1 to about 20 weight percent of a humectant, based on the weight of the thermoplastic polymer. The humectant may be (1) ethylene glycol or (2) polyethylene glycol (e.g. having a weight-average molecular weight of from about 100 to about 40,000, preferably about 200 to about 800).

The viscosity modifier may be a polyethylene glycol having a weight average molecular weight of from 100,000 to about 2,000,000, preferably from about 100,000 to about 600,000. The viscosity modifier may be low or high viscosity methyl cellulose or polyvinyl alcohol.

The Adhesion Layer may also include about 0.1 to about 5 weight percent of a weak acid, based on the weight of the thermoplastic polymer. The Adhesion Layer may also include about 0.5 to about 5 weight percent of a surfactant (e.g. nonionic or cationic), based on the weight of the thermoplastic polymer.

The Adhesion Layer may further comprise from about 1 to about 20 weight percent of a humectant, based on the weight of the thermoplastic polymer (and optionally from about 0.2 to about 10 weight percent of a fluid (e.g. ink) viscosity modifier, based on the weight of the thermoplastic polymer), and from 0.5 to about 5 weight percent of a surfactant, based on the weight of the thermoplastic polymer.

The Adhesion Layer of the present invention may also utilize the materials of the image receptive melt-transfer film layer of U.S. Pat. No. 5,271,990.

In this embodiment, the Adhesion Layer may be comprised of a thermoplastic polymer which melts at above 65° C., preferably above 100° C., and more preferably in the range of from about 100 to about 180 degrees Celsius(° C.). In another embodiment, the thermoplastic polymer melts in the range of from about 80° C. to 120° C., preferably from 100° C. to about 120° C.

The nature of the thermoplastic polymer is not known to be critical. That is, any known thermoplastic polymer can be employed so long as it meets the criteria specified herein. Preferably, the thermoplastic polymer is selected from the group consisting of polyolefins, polyesters, and ethylene-vinyl acetate copolymers, having a particle size of less than 50 micrometers, preferably having a particle size of less than 20, and more preferably less than 10 micrometers.

In general, the Adhesion Layer, corresponding to the melt-transfer film layer of the '990 patent, is comprised of a first thermoplastic polymer and the image receptive film layer is comprised of a second thermoplastic polymer, each of which melts above 65° C., preferably above 100° C., and more preferably in the range of from about 100° C. to about 180° C. Preferably, the first thermoplastic polymer is selected from the group consisting of polyolefins, polyesters, ethylene-vinyl acetate copolymers, ethylene-methacrylic acid copolymers, and ethyleneacrylic acid copolymers. In addition, the second thermoplastic polymer preferably is selected from the group consisting of polyolefins, polyesters, and ethylene-vinyl acetate copolymers.

Again, reference herein to a melting temperature or range is meant only to indicate an approximate temperature or range at which a thermoplastic polymer melts and flows under film forming conditions to result in a substantially smooth film.

Accordingly, the Adhesion Layer may comprise a thermoplastic polymer selected from the group consisting of polyolefins, polyesters, and ethylene-vinyl acetate copolymers and which melts above 65° C., and preferably above 100° C., and more preferably in the range of from about 100 to about 180 degrees Celsius, and most preferably in the range of about 100 to about 120 degrees Celsius.

An example of the Adhesion Layer of the invention is produced by coextruding a 25 micrometer film of Elvax 3200 and a 19 micrometer film of Surlyn 1702 as described in Example 1 of U.S. Pat. No. 5,271,990. Elvax 3200 is supplied by E. I. Du Pont de Nemours & Company, Inc., Polymer Products Department, Ethylene Polymers Division, Wilmington, Del. Elvax 3200 is an ethylene vinyl acetate copolymer containing approximately 25% vinyl acetate and modified with wax. It has a melt index of 32 g/10 minutes. Surlyn 1702 is also supplied by DuPont. Surlyn 1702 is an ionomer consisting of a cross-linked ethylene-methacrylic acid copolymer having a melt index of 14 g/10 minutes.

In another embodiment, the Adhesion Layer of the present invention may also utilize the materials of the image-receptive melt-transfer film layer of U.S. Pat. No. 5,242,739.

The Adhesion Layer may comprise from about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylenevinyl acetate copolymers, wherein each of said film-forming binder and said powdered thermoplastic polymer melts above about 65° C., preferably above about 100, and more preferably in the range of from about 100 to about 180 degrees Celsius and said powdered thermoplastic is preferably of particles which are from about 1 to about 50 micrometers in diameter, preferably about 2 to 50, and more preferably 1 to about 20 micrometers in diameter.

Thus, the Adhesion Layer comprises from about 15 to about 80 percent by weight of a film-forming binder and from about 85 to about 20 percent by weight of a powdered thermoplastic polymer. Each of the film-forming binders and powdered thermoplastic polymers melt above 65° C., preferably above 100° C., and more preferably in the range of from about 100 to about 180 degrees Celsius (° C.). In addition, the powdered thermoplastic polymer is preferably composed of particles having diameters of about 50 micrometers, more preferably from about 2 to 50 micrometers, and most preferably from about 1 to about 20 micrometers.

In other embodiments, each of the film-forming binders and powered thermoplastic polymers melt in the range from 80° C. to above 120° C., preferably in the range of from about 100° C. to about 120° C.

The function of the powdered thermoplastic polymer is to assist in the adhering of an image to a fabric, both in terms of ease of heat setting and the permanence of the transferred image.

The nature of the film-forming binder is not known to be critical. That is, any film-forming binder can be employed so long as it meets the criteria specified herein. In preferred embodiments, the film-forming binder has, at the transfer temperature, a lower melt viscosity than the powdered thermoplastic polymer. As a practical matter, water-dispersible ethylene-acrylic acid copolymers have been found to be especially effective film forming binders.

In general, the powdered thermoplastic polymer can be any thermoplastic polymer which meets the criteria set forth herein. Preferably, the powdered thermoplastic polymer is selected from the group consisting of polyolefins, polyesters, and ethylenevinyl acetate copolymers.

The Adhesion Layer, corresponding to the melt-transfer film layer, comprises a film-forming binder as already described. The image-receptive film layer preferably comprises from about 15 to about 80 percent by weight of a film-forming binder (e.g. ethylene-acrylic acid copolymers; polyolefins and waxes which melt in the range of about 65 to about 180 degrees Celsius). The melt Adhesion Layer may also contain from about 85 to about 20 percent by weight of a powdered thermoplastic polymer, each of which are as already defined.

As a general rule, the amount of powdered thermoplastic polymer employed can be reduced if larger particle sizes are employed.

If desired, any embodiment of the Adhesion Layer can contain other materials, such as processing aids, release agents, pigments, Reglossing agents, antifoam agents, and the like. The use of these and other like materials is well known to those having ordinary skill in the art.

Representative binders include Binders A–G discussed above and the following powdered thermoplastic polymers.

Powdered Thermoplastic Polymer A

This powdered polymer is Microthene® FE 532, an ethylenevinyl acetate copolymer supplied by Quantum Industries, Cincinnati, Ohio. The particle size is reported to be 20 micrometers. The vicat softening point is 75° C. and the melt index is 9 g/10 minutes.

Powdered Thermoplastic Polymer B

Powdered Thermoplastic Polymer B is Aqua Polysilk 19. It is a micronized polyethylene wax containing some polytetrafluoroethylene. The average particle size is 18 micrometers and the melting point of the polymer is 102°–118° C. The material is supplied by Micro Powders, Inc., Scarsdale, N.Y.

Powdered Thermoplastic Polymer C

This material is Microthene® FN-500, a polyethylene powder supplied by USI Chemicals Co., Cincinnati, Ohio. The material has a particle size of 20 micrometers, a Vicat softening point of 83° C., and a melt index of 22 g/10 minutes.

Powdered Thermoplastic Polymer D

This polymer is Aquawax 114, supplied by Micro Powders, Inc., Scarsdale, N.Y. The polymer has a reported melting point of 91°–93° C. and an average particle size of 3.5 micrometers; the maximum particle size is stated to be 13 micrometers.

Powdered Thermoplastic Polymer E

Powdered Thermoplastic Polymer E is Corvel® 23-9030, a clear polyester from the Powder Coatings Group of the Morton Chemical Division, Morton Thiokol, Inc., Reading, Pa.

Powdered Thermoplastic Polymer F

This material is Corvel® natural nylon 20-9001, also supplied by Morton Thiokol, Inc.

Powdered Thermoplastic Polymer G

This polymer powder is Corvel® clear epoxy 13-9020, supplied by Morton Thiokol, Inc.

Powdered Thermoplastic Polymer H

Powdered Thermoplastic Polymer H is AClyn® 246A, which has a melting temperature of about 95° C. as determined by differential scanning calorimetry. The polymer is an ethyleneacrylic acid magnesium ionomer. The material is supplied by Allied-Signal, Inc., Morristown, N.J.

Powdered Thermoplastic Polymer I

This polymer is AC-316A, an oxidized high density polyethylene. The material is supplied by Allied Chemical Company, Morristown, N.J.

Powdered Thermoplastic Polymer J

This polymer is Texture 5380, supplied by Shamrock Technologies, Inc., Newark, N.J. It is powdered polypropylene having a melting point of 165° C and an average particle size of 40 micrometers.

The binders and thermoplastic polymers may be combined and blended as desired. For example, Binder A (e.g. 80 parts) may be blended with powdered thermoplastic polymer A (e.g. 80 parts) and optionally with a fluorocarbon dispersion such as Zonyl 7040 (e.g. 0.20 parts) obtained from duPont. Another example includes combining Binder B (e.g. 400 parts) and Polymer B (e.g. 70 parts) and blending in a standard laboratory colloid mill. Also, Binder A (e.g. 286 parts) may be combined with Polymer C (e.g. 65 parts). Binder B (e.g. 400 parts) may be combined with Polymer D (e.g. 70 parts). Binder C (e.g. 200 parts) may be combined with Polymer E (e.g. 35 parts) and optionally with propylene glycol (e.g. 20 parts) and water (e.g. 20 parts). Similarly, Binder C (e.g. 200 parts) may be combined with Polymer F (e.g. 54 parts) and optionally with propylene glycol (e.g. 20 parts) and water (e.g. 20 parts). Also, Binder A (e.g. 200 parts) may be combined with Polymer G (e.g. 30 parts) and optionally with propylene glycol (e.g. 20 parts) and water (e.g. 20 parts). Binder D (e.g. 200 parts) may be combined with Polymer H (e.g. 30 parts) and optionally water (e.g. 40 parts) and blended. Binder A (e.g. 286 parts) may be combined with Polymer J (e.g. 40 parts) and optionally with propylene glycol (e.g. 50 parts).

When the PSA layer according to the present invention is used, any conventional adhesion layer may be employed. Moreover, this adhesion layer may be applied using any conventional method, for example, extrusion coating or water based coating. However, if the PSA layer according to the present invention is not employed, the adhesion layer should not be coated using extrusion coating, but rather using water based coating such as described in co-pending U.S. application Ser. No. 09/557,173, filed Apr. 21, 2000. Further, the surface energy difference parameters described above should be adhered to. In particular, when the PSA layer of the present invention is not employed, the surface energy difference between the selected barrier layer and the Adhesion Layer must be between about 0 to about 50 dynes/cm, preferably about 0 to about 30 dynes/cm, most preferably about 0 to about 15 dynes/cm.

5. Opaque Layer A

When one or more opaque layers are employed, the opaque layer supports the image receiving layer(s) and serves to render the image visible against a dark receptor, and otherwise improves the appearance and readability of an image, such as, for instance, a bar code or a color image.

Upon peeling, the label or heat setting material may carry some of the PSA along with the adhesive layers(s) and the opaque layer(s). For example, when permanently adhering the label to a textile, the opaque layer(s) layers preferably will be thermoplastic and optionally thermosetting as they are applied to a porous substrate such as a fabric. When a thermosettable formulation is employed for the pressure sensitive adhesive and/or opaque layers, the label fused into the fabric will have the maximum resistance to washing or dry cleaning.

The first optional opaque layer (Opaque layer A) adds a rigid or stiff quality to the entire heat-setting label sheet for ease of handling, as well as having a white (or colored) opacity. Any pigmented resin may be used to achieve the desired outcome.

A preferred embodiment of opaque layer A, Opaque Layer formulation 1 comprises styrene-butadiene latex, thermoplastic elastomer, an elastomer and an optional pigment.

All the above chemicals form a homogeneous dispersion aided by a stir bar at a low to medium stir rate. All mixing can be done at room temperature. After coating, the preferred thickness of Opaque Layer A is about 1.5 mils (wet).

In the above-described preferred embodiment, a pigment such as a white pigment may be used to exhibit opacity capabilities. Also in the preferred embodiment, the latex is the primary chemical imparting the rigid characteristics upon drying. The thermoplastic elastomer and acrylonic copolymer impart stretchability and flexibility in the final transferred product.

6. Opaque Layer B

The optional Opaque Layer B preferably contains a pigment (such as a white pigment) and provides opacity. A preferred embodiment of the optional opaque layer B. Opaque Layer Formulation 1, comprises a vinyl acetate-ethylene copolymer, thermoplastic elastomer, an elastomer and an optional pigment such as $TiO_2$.

The thermoplastic elastomer acrylonitrile copolymer impart stretchability and flexibility in the final transferred product. Practically any $TiO_2$ powder addition, present at about 25% of the total formula, will provide the desired opacity. Other powdered pigments may need to be added at varying percentages to achieve the desired opacity and color intensity.

All liquid chemicals are homogenized in the presence of a stir bar and a low speed. Upon homogenization, the pigment powder is added slowly in the presence of a high stir speed provide by a stir flea. All mixing of the above ingredients should be performed at room temperature. Preferably, optional Opaque Layer B is coated on the heat setting label sheet at a weight of about 1.0 to 1.5 mils (wet).

7. Image Receiving Layer

At least one of the coatings of the present invention should be able to retain an image such as an image dye. However, when no opaque layer is used, as in a transparent label, and/or the Adhesion Layer is not capable of retaining a dye, the image receiving layer (IRL) of the invention is required. The IRL retains dyes, such as ink from ink jet printers, or dyes from a waterbased marker. If an ink jet ink is utilized, the image preferably has comparable resolution to standard ink jet paper. After peeling and upon the application of heat, the Adhesion Layer, the opaque layer(s) if employed, and the optional IRL become heat activated (e.g. melt and flow) to trap or encapsulate the dye image or ink and optionally impart waterfast characteristics.

The IRL comprises binders, such as polyvinyl alcohol (PVOH), various colorant retention aids, and an antioxidant. An antioxidant is added to keep the polyvinyl alcohol (PVOH) from discoloring (yellowing) during the heat process.

Other polyvinyl alchols may be used which are considered to be of fully hydrolyzed (98.0–98.8% hydrolysis) or preferably super hydrolyzed grade (99.3+% hydrolysis).

Suitable antioxidants include, but are not limited to, BHA; Bis(2,4-di-t-butylphenyl)pentaerythritol diphosphite; 4,4'-Butylidenebis (6-t-butyl-m-cresol), C20–40 alcohols; p-Crescol/dicyclopentadiene butylated reaction product, Di (butyl, methyl pyrophosphato) ethylene titanate di (dioctyl, hydrogen phosphate); Dicyclo (dioctyl) pyrophosphato titanate; Di(dioctylphosphato) ethylene titanate; Di (dioctylpyrophosphato) ethylene titanate; Disobutyl nonyl phenol; Dimethylaminomethyl phenol, Ethylhydroxymethyloleyl oxazoline Isopropyl 4aminobenzenesulfonyl di (dodecylbenzenesulfonyl) titanate; Isopropyldimethacrylisoslearoyl titanate; Isopropyl (dioctylphosphato) titanate; isopropyltridioctylpyrophosphato) titanate; Isopropyl tri (N ethylamino-ethylamino) titanate, Lead phthalate, basic 2,2-Methylenebis (6-t-butyl-4-methylphenol), octadecyl 3,5-di-t-butyl-4-hydroxyhydrocinnamate Phosphorus; Phosphorus tnchloride, reaction prods. with 1,1'-biphenyl and 2,4-bis (1,1-dimethylethyl) phenol Tetra (2, diallyoxymethyl-1 butoxy titanium di (di-tridecyl) phosphite; Tetraisopropyl di (dioctylphosphito) titanate; Tetrakis [methylene (3,5-di-tbutyl-4-hydroxyhydrocinnamate)]methane; Tetraoctyloxytitanium; di (ditridecylphosphite); 4,4'-Thiobis6-(t-butyl-m-cresol); Titanium di (butyl, octyl pyrophosphate) di (diocLyl, hydrogen phosphite) oxyacetate; Titanium di (cumylphenylate) oxyacetate; Titanium di (dioctylpyrophosphate), oxyacelate; Titanium dimethyacrylate oxyacetate; 2,2,4-Trimethyl-1,2-dihydroquinoline polymer; Tris(nonylphenyl) phosphite.

Preferably, the antioxidant used is octadecyl 3,5-Di-tert-butyl-4-hydroxyhydrocinnamate. An aqueous solution of a cationic amine polymer-epichlorohydrin adduct acts as the dye retention aid. An additional binder is included in order to impart colorant retention and mechanical stability. A list of applicable binders include, but are not limited to, those listed in U.S. Pat. No. 5,798,179, in addition to polyolefins, polyesters, ethylene-vinyl acetate copolymers, ethylene-methacrylate acid copolymers, and ethylene-acrylic acid copolymers. Suitable coating weight is in the range of 1.0–20.0 g/m² (dry), preferably in the range of 1.0–10 g/m² (dry).

Chemically, the IRL of the invention corresponds to virtually all known image receiving layers in the art of transfer images to t-shirts. However, the image receiving layer of the invention either does not melt when heat is applied or melts at a temperature above the melting temperature of the Adhesion Layer. Preferably, the image receiving layer does not melt below 260° C. Preferred Adhesion Layers of the present invention are known release layers assigned to or disclosed by Kimberly Clark Corporation, of Georgia, and Foto-Wear, Inc. of Milford, Pa.

The image receiving layer functions as a retention aid for the image. Accordingly, the image receiving layer should preferably be optimized depending on the marker that is being applied in accordance with the knowledge of one of ordinary skill in the art. Preferably, the image layer would contain polyethylene wax (Allied Signal, Acumist A-12).

In an embodiment where the support is marked with a laser copier or printer, the optional image receiving layer is an acrylic coating upon which an image is applied. The image receiving layer may comprise a film-forming binder selected from the group comprising of ethylene-acrylic acid copolymers, polyolefins, and waxes. A preferred binder, especially when a laser copier or laser printer is used in accordance with this invention is an ethylene acrylic acid co-polymer dispersion. Such a dispersion is represented by Image Receiving Layer Formulation 2.

Alternatively, the binders suitable for Adhesion Layer Formulation 2 may be used in lieu of the above-described ethylene acrylic acid copolymer dispersion.

In another embodiment of the invention, when an ink jet printer is used in accordance with the present invention, the image receiving layer may utilize the materials of the fourth layer of U.S. Pat. No. 5,798,179. Thus, for practicing the present invention using an ink jet printer, the image receiving layer may comprise particles of a thermoplastic polymer having largest dimensions of less than about 50 micrometers. Preferably, the particles will have largest dimensions of less than about 50 micrometers. More preferably, the particles will have largest dimensions of less than about 20 micrometers. In general, the thermoplastic polymer may be any thermoplastic polymer which meets the criteria set forth herein. Desirably, the powdered thermoplastic polymer will be selected from the group consisting of polyolefins, polyesters, polyamides, and ethylene-vinyl acetate copolymers.

The Image Receiving Layer also includes from about 10 to about 50 weight percent of a film-forming binder, based on the weight of the thermoplastic polymer. Desirably, the amount of binder will be from about 10 to about 30 weight percent. In general, any film-forming binder may be employed which meets the criteria set forth herein. When the Image Receiving Layer includes a cationic polymer as described below, a nonionic or cationic dispersion or solution may be employed as the binder. Suitable binders include polyacrylates, polyethylenes, and ethylene-vinyl acetate copolymers. The latter are particularly desired because of their stability in the presence of cationic polymers. The binder desirably will be heat softenable at temperatures of about 120° C. or lower.

The Image Receiving Layer typically will have a melting point of from about 65° C. to about 180° C., but the selection thereof is subject to the limitation that it must melt at a higher melting temperature than the Adhesion Layer. Moreover, the image receiving layer may contain from about 2 to about 20 weight percent of a cationic polymer, based on the weight of the thermoplastic polymer. The cationic polymer may be, for example, an amide-epichlorohydrin polymer, polyacrylamides with cationic functional groups, polyethyleneimines, polydiallylamines, and the like. When a cationic polymer is present, a compatible binder should be selected, such as a nonionic or cationic dispersion or solution. As is well known in the paper coating art, many commercially available binders have anionically charged particles or polymer molecules. These materials are generally not compatible with the cationic polymer which may be used in the Image Receiving Layer.

One or more other components may be used in the Image Receiving Layer. For example, this layer may contain from about 1 to about 20 weight percent of a humectant, based on the weight of the thermoplastic polymer. Desirably, the humectant will be selected from the group consisting of ethylene glycol and poly(ethylene glycol). The poly (ethylene glycol) typically will have a weight-average molecular weight of from about 100 to about 40,000. A poly(ethylene glycol) having a weight-average molecular weight of from about 200 to about 800 is particularly useful.

The Image Receiving Layer also may contain from about 0.2 to about 10 weight percent of an ink viscosity modifier, based on the weight of the thermoplastic polymer. The viscosity modifier desirably will be a poly(ethylene glycol) having a weight-average molecular weight of from about 100,000 to about 2,000,000. The poly(ethylene glycol) desirably will have a weight-average molecular weight of from about 100,000 to about 600,000.

Other components which may be present in the Image Receiving Layer include from about 0.1 to about 5 weight percent of a weak acid and from about 0.5 to about 5 weight percent of a surfactant, both based on the weight of the thermoplastic polymer. A particularly useful weak acid is citric acid. The term "weak acid" is used herein to mean an acid having a dissociation constant less than one (or a negative log of the dissociation constant greater than 1).

The surfactant may be an anionic, a nonionic, or a cationic surfactant. When a cationic polymer is present in the Image Receiving Layer, the surfactant should not be an anionic surfactant. Desirably, the surfactant will be a nonionic or cationic surfactant. However, in the absence of the cationic polymer, an anionic surfactant may be used, if desired. Examples of anionic surfactants include, among others, linear and branched-chain sodium alkylbenzenesulfonates, linear and branched-chain alkyl sulfates, and linear and branched-chain alkyl ethoxy sulfates. Cationic surfactants include, by way of illustration, tallow trimethylammonium chloride. Examples of nonionic surfactants, include, again by way of illustration only, alkyl polyethoxylates, polyethoxylated alkylphenols, fatty acid ethanol amides, complex polymers of ethylene oxide, propylene oxide, and alcohols, and polysiloxane polyethers. More desirably, the surfactant will be a nonionic surfactant.

The image receiving layer may contain the addition of filler agents with the purpose of modulating the surface characteristics of the present invention. The surface roughness and coefficient of friction may need to be modulated depending on such factors as desired surface gloss and the imaging device's specific paper feeding requirements. The filler can be selected from a group of polymers such as, for example, polyacrylates, polyacrylics, polyethylene, polyethylene acrylic copolymers and polyethylene acrylate copolymers, vinyl acetate copolymers and polyvinyl polymer blends that have various particle dimensions and shapes. Typical particle sizes may range from 0.1 to 500 microns. Preferably, the particle sizes range from 5 to 100 microns. More preferably, the particle sizes range from 5 to 30 microns. The filler may also be selected from a group of polymers such as, for example, cellulose, hydroxycellulose, starch and dextran. Silicas and mica may also be selected as a filler. The filler is homogeneously dispersed in the image layer in concentrations ranging from 0.1 to 50%. Preferably, the filler concentration range is 1 to 10 percent. Preferred image receiving layer formulations that further contain a filler agent are Image Receiving Layer Formulation 3 and 4.

As stated above, if an ink jet printer is used as the imaging mechanism, the image receiving layer retains ink from the ink jet printer with comparable resolution to a standard ink jet printer. The image receiving layer becomes heat activated to trap ink and impart wash characteristics. A preferred embodiment of the image receiving layer is Image Receiving Layer Formulation 5, which comprises a PVOH solution, an amine polymer, a thermoplastic polymer, a thermoplastic elastomer, and an antioxidant.

As stated above, an antioxidant is preferably added to keep the PVOH from discoloring or yellowing upon application of heat. The amine polymer acts as the dye retention/binder. Both thermoplastic chemicals allow the layer to fuse, or melt, thus trapping all inks onto the layer and imparting a water resistance upon heating. The elastomeric property is helpful in giving the layer flexibility and useful stretch characteristics so the final product does not tear or crack as easily.

The antioxidant powder is added to a specified amount of PVOH solution and heated to approximately 60° C. and allowed to mix at medium speed for approximately 30 minutes. Upon incorporation of the antioxidant to the PVOH solution, the solution cools to room temperature, followed by incorporation of the remaining chemicals in the presence of a medium stir rate provided by a stir bar. Preferably, upon coating the image receiving layer will have a thickness of about 1.0 mil (wet).

In a preferred embodiment of the present invention, the image receiving layer according to copending applications 60/157,018, filed Oct. 1, 1999 or 60/220,199, filed Jul. 24, 2000 may be used. These copending applications are herein incorporated by reference.

The various layers of the heat-setting label sheet are formed by known coating techniques, such as by curtain coating, Meyer rod, roll, blade, air knife, cascade and gravure coating procedures.

In a preferred embodiment of the invention, the first layer to be coated on the support is the pressure sensitive adhesive layer. The pressure sensitive adhesive layer, if present, is followed by the Adhesion Layer, and then the optional opaque layers(s) and the image receiving layer. If the pressure sensitive adhesive layer is not present, the first layer coated on the base will likely be a barrier layer.

In referring to FIG. 1, there is generally illustrated a cross-sectional view of a heat-setting label sheet 20 of the present invention. The support 21 comprises a top and bottom surface. The pressure sensitive adhesive layer 22 is coated onto the top surface of the support 21. The Adhesion Layer 23 is then coated onto the pressure sensitive adhesive layer 22. The optional opaque layer(s) 24 are coated onto the Adhesion Layer. Finally, the image receiving layer 25 is coated on top of the opaque layer(s) 24. Each component in the support coating plays a role in the transfer process. The pressure sensitive adhesive layer allows for easy removal or peeling of the heat sealing material (the label) solution. The Adhesion Layer effectively provides adhesion of subsequent layers and the printed image to the receptor. The opaque layer(s) provide opacity and rigidity to the heat-setting label sheet.

After the image receiving layer has completely dried, an antistatic agent discussed above may be applied to the noncoated side of the transfer sheet as an antistatic layer 26. The coating will help eliminate copier or printer jamming by preventing the electrostatic adhesion of the paper base to the copier drum of electrostatic copiers and printers.

Additional Additives

Any of the layers of the heat-setting label sheet may further comprise an additive capable of emitting radiation within the visible light spectrum. The preferred layers for this additive are the adhesive layer and the image receiving layer, most preferably the release layer. For example, this additive may be organic, inorganic and/or organometallic compounds that have a quantum yield for fluorescence in the range of from 0.001 to 1.0. Alternatively, the additive may be organic, inorganic and/or an organometallic compounds that have a quantum yield for phosphorescence in the range of from 0.001 to 1.0. These additive systems may have radiative lifetimes of at least one nanosecond.

Examples of a suitable inorganic compound include those derived from lanthanide, alkali earth or transition metals which are reacted with elements of groups four, five or six of the Periodic Table. Additional examples of suitable inorganic compounds include those derived from members of the alkali earth or transition metals which are reacted with sulfur, thereby producing a luminescent sulfide complex. Examples of luminescent sulfide complexes include luminescent pigments such as zinc sulfide, copper sulfide, strontium sulfide or combinations thereof.

Examples of a suitable organic compound include aromatic and polycyclic aromatic compounds, such as coumarin, rhodamine, fluorescein and their derivatives, as well as 2,5-diphenyloxazole and 1,4-Bis(5-phenyloxazol-2-yl)benzene. Fluorescein derivatives and isomers may be the sodium salt forms, fluoresceinamine, diacetate and isothiocyanate. Coumarin isomers and derivatives include Coumarin-1, Coumarin-4. Coumarin-6, Coumarin-7, Coumarin-120, Coumarin-152, Coumarin-314, Coumarin-334, Coumarin-337, Coumarin-343 and carboxylated isomer derivatives. Rhodamine isomers and derivatives include rhodamine-123, rhodamine-B, rhodamine-B isocyanate, rhodamine-6G, rhodamine-6G perchlorate, rhodamine-6G tetrafluoroborate and rhodamine-110. The lactone derivatives of each of these may also be used.

Other systems include azo dyes such as CI Direct Yellow 86, CI Acid Red 249 and CI Direct Blue 199. Member dyes from the meracyanine, carbocyanine, indolene, imidazol, thiozole and oxazole class of compounds may also be selected. Organometallic systems may include metal containing substituted porphyrins, such as phthalocyanine complexed with members of the transition groups 6B, 8B, 1B and 2B. Porphyrin systems, such as Mesoporphyrin IX, complexed with the same transition element groups may also be selected.

The additives capable of emitting radiation within the visible light spectrum may be present at concentrations in the range of from 0.05% to 80%, preferably 0.05% to 20%, and most preferably 0.05% to 10% by dry weight.

B. Receptor

The receptor or receiving element receives the transferred image. A suitable receptor includes but is not limited to textiles including cotton fabric, and cotton blend fabric. The receptor element may also include glass, metal, wool, plastic, ceramic or any other suitable receptor. Preferably the receptor element is a tee shirt or the like.

To transfer the image, the heat-setting label sheet is imaged by, for example, an ink jet printer. The heat sealing material (or label portion) is peeled away from the base and placed on the receptor element. A heating device (i.e., a hand iron or heat press) is used to apply heat and pressure to the label which in turn activates the heat-sealing material and the label adheres to the receptor. The temperature range of the hand iron is generally in the range of 110 to 220° C. with about 190° C. being the preferred temperature. The heat press operates at a temperature range of 100 to 220° C. with about 190° C. being the preferred temperature. Alternatively, the heating device is placed over the non-image side of the support and moved in a circular motion (hand iron only). Pressure (i.e., typical pressure applied during ironing) must be applied as the heating device is moved over the label or alternatively over the support (see FIG. 1). After about two minutes to five minutes (with about three minutes being preferred) using a hand iron and 10 seconds to 50 seconds using a heat press (with about twenty seconds being preferred) of heat and pressure, the transfer device is removed from the label or alternatively the support. Optionally, a sheet of paper or protective film may be placed in-between the label and heating device to protect the image and/or upper layers of the label from damage caused by the heating device during the heating period.

As an alternative embodiment of the present invention, after the label portion of the heat-setting label sheet is placed on the receptor (i.e., a tee shirt), the label portion may be set by ironing the label indirectly (i.e., the back side of the tee shirt). That is, the heating is applied to the label through the tee shirt and not directly to the label.

In a preferred embodiment, the method of ironing as described in co-pending application No. 09/453,881, which is herein incorporated by reference, can be used.

The following examples are provided for a further understanding of the invention, however, the invention is not to be construed as limited thereto.

EXAMPLE 1

An example of Barrier Layer Formulation 1 is as follows:

| Barrier Layer Formulation 1 | |
| --- | --- |
| Components | Parts |
| Vinyl acetate-dibutyl maleate polymer dispersion (such as EVERFLEX G. Hampshire Chemical Corporation) | 50 parts |
| Water | 50 parts. |

EXAMPLE 2

An example of the PMMA-containing barrier layer is Barrier Layer Formulation 2:

| Barrier Layer Formulation 2 | |
| --- | --- |
| Components | Parts |
| Acetone 99.5% | 40 parts (weight) |
| 2-Propanol 99.5%. | 40 parts (weight) |
| PMMA | 20 parts (weight). |

EXAMPLE 3

| Pressure Sensitive Adhesive Layer Formulation 1 | |
| --- | --- |
| Ingredient | Parts |
| Acrylic Polymer Adhesive (Grafix-2000, Super-Tek Products Inc., Woodside, KY) | 95.0 |
| Water | 5.0 |

The Grafix-2000 as used above is diluted to a high viscosity. The two components mix in the presence of a stir bar at low stir speeds. The mixing is done at room temperature.

EXAMPLE 4

An example of the Adhesion Layer of the present invention is as follows:

| Adhesion Layer Formulation 1 | |
|---|---|
| Components | Parts by weight |
| Ethylene Acrylic Acid Co-polymer Dispersion (Michem Prime 4983R, Michelman) | 86 parts |
| Elastomeric emulsion (Hystretch V-29, BF Goodrich) | 5 parts |
| Polyurethane Dispersion (Daotan VTW 1265, Vianova Resins) | 4 parts |
| Polyethylene Glycol (Carbowax Polyethylene Glycol 400, Union Carbide) | 4 parts |
| Polyethylene Glycol Mono ((Tetramethylbutyl) Phenol) Ether (Triton X-100, Union Carbide) | 1 part |

Adhesion Layer Formulation 1 may be prepared as follows: five parts of the elastomer dispersion are combined with eighty-six parts of an ethylene acrylic acid co-polymers dispersion by gentle stirring to avoid cavitation. Four parts of a polyurethane dispersion are then added to the mixture. Immediately following the addition of a polyurethane dispersion, four parts of a polyethylene glycol and one part of an nonionic surfactant (e.g., Triton X-100) are added. The entire mixture is allowed to stir for approximately fifteen minutes at a moderate-stir rate (up to but not exceeding a rate where cavitation occurs). Once thoroughly combined, the mixture is filtered (for example, through a 53 $\mu$m nylon mesh).

EXAMPLE 5

An additional example of the Adhesion Layer of the present invention is as follows:

| Adhesion Layer Formulation 2 | |
|---|---|
| Components | Parts |
| Ethylene Acrylic Acid Co-polymers dispersion (Michem Prime 4938R, Michelman) | 74 parts (weight) |
| Wax Dispersion (Michelman 73635M, Michelman) | 25 parts (weight) |
| Retention Aid (Hercobond 2000, Hercules) | 1 part (weight) |

Formulation 2 may be prepared in the following manner: the ethylene acrylic acid co-polymer dispersion and the wax dispersion are stirred (for example in a beaker with a stirring bar). The retention aid is added, and the stirring continues until the retention aid is completely dispersed.

EXAMPLE 6

A more preferred embodiment of the Adhesion Layer is the following formulation:

| Adhesion Layer Formulation 3 | |
|---|---|
| Ingredient | Parts |
| Ethylene Acrylic Acid (Michem Prime 4983R, Michelman Corp., Cincinatti, OH) | 66.0 |
| Acrylic Latex (Hycar 26120, BF Goodrich, Cleveland, OH). | 33.0 |

In mixing, the above ingredients form a homogenous solution aided by the presence of a stir bar at a low to medium stir rate. The mixing may be performed at room temperature. Adhesion Layer Formulation 3 is preferably about 3.0 mils (wet) after coating.

EXAMPLE 7

An example of Opaque Layer A is as follows:

| Opaque Layer A Formulation 1 | |
|---|---|
| Ingredient | Parts |
| Sryrene-Butadiene Latex (Latex CP 615NA, Dow Chemical Co., Midland, MI) | 40 |
| Pigment in Resin Solution (Arrowvure F. Flink Ink CO., W. Hazelton, PA) | 25 |
| Thermoplastic Elastomer (Hystretch V-29, BF Goodrich, Cleveland, OH) | 17.5 |
| Elastomer (Hycar 1561, BF Goodrich, Cleveland, OH) | 17.5 |

EXAMPLE 8

An example of Opaque Layer B is as follows:

| Opaque Layer B Formulation 1 | |
|---|---|
| Ingrediant | Parts |
| Vinyl Acetate-Ethylene Copolymer (Airflex 124, Airproducts Inc., Allentown, PA) | 35 |
| TiO2 Powder Pigment (TiPure R706, DuPont Chemicals, Wilmington, DE) | 25 |
| Thermoplastic Elastomer (Hystretch V-29, BF Goodrich, Cleveland, OH) | 25 |
| Elastomer 15 (Hycar 1561, BF Goodrich, Cleveland, OH). | |

EXAMPLE 9

A preferred Image receiving Layer is described below:

| IRL Formulation 1 | |
|---|---|
| Ingredient | Parts |
| PVOH at a 5–15% solution in water (Airvol 125, Airproduct Inc., Allentown, PA) | 55.00–90.00 |

-continued

IRL Formulation 1

| Ingredient | Parts |
|---|---|
| Amine polymer (Kymene 450, Hercules Inc., Wilmington, DE) | 23.00–9.00 |
| Styrene Butadiene Latex (Latex XUR-YM-12274, Dow Chemical, Midland, MI) | 20.00–0.99 |
| Antioxidant (Irganox 1076, Ciba Specialty Chemicals Tarrytown, NY) | 2.00–0.01 |

IRL formula 1 may be prepared as follows: In beaker A, the antioxidant powder is added to specified amount of PVOH solution, heated to approximately 60° C., and mixed at medium stir speed for approximately 30 minutes. Upon incorporation of the antioxidant to the PVOH solution, the solution is cooled to room temperature. In beaker B, the styrene butadiene latex and amine polymer are at a medium stir rate. The Beaker A contents are slowly added to Beaker B and allowed to homogenize in the presence of a medium stir rate. The solution may be filtered with a 50–150µ filter. By filtering the solution, undesired particulates can be separated from the bulk solution. The Adhesion Layer formula is coated at room temperature onto the support in a single pass of a #30 Meyer Rod and force air dried. The IL is coated directly onto the Adhesion Layer with a single pass of a #04 Meyer Rod, and force air dried.

EXAMPLE 10

Image Receiving Layer Formulation 2

| Components | Parts |
|---|---|
| Ethylene Acrylic Acid Co-polymers Dispersion (Michem Prime 4933R, Michelman). | 100 parts |

EXAMPLE 11

Image Receiving Layer Formulation 3

| Compound | Parts |
|---|---|
| Ethylene Acrylic Copolymer Dispersion (Michem 4983R, Michelman) | 90 to 99 |
| Ethylene Vinyl Acetate Copolymer Powder (Microthene FE-532-00, Equistar Chemical) | 10 to 1 |

EXAMPLE 12

Image Receiving Layer Formulation 4

| Compound | Parts |
|---|---|
| Ethylene Acrylic Copolymer Dispersion (Michem 4983R, Michelman) | 90 to 99 |
| Oxidized polyethylene homopolymer (ACumist A-12, Allied Signal Chemical) | 10 to 1 |

EXAMPLE 13

By way of illustration, the image receiving layer may optionally comprise the following formulation compositions:

| Formulation | Description |
|---|---|
| A | 100 parts Orgasol 3501 EXDNAT 1 (a 10-micrometer average particle size, porous, copolymer of nylon 6 and nylon 12 precursors), 25 parts Michem Prime 4983, 5 parts Triton X100 and 1 part Methocel A-15 (methyl cellulose). The coating weight is 3.5 lb. per 1300 square feet. |
| B | Like A, but with 5 parts of Tamol 731 per 100 parts Orgasol 3501, and the Metholcel A-15 is omitted. |
| C | Like a Reichold 97-635 release coat (a modified poly(vinyl acetate)), but containing 50 parts of Tone 0201 (a low molecular weight polycaprolactone) per 100 parts Orgasol 3501. |
| D | 100 parts Orgasol 3501, 5 parts Tamol 731, 25 parts Michel Prime 4983 and 20 parts PEG 20M. |
| E | 100 parts Orgasol 3501, 5 parts Tamol 731, 25 parts Michel Prime 4983 and 5 parts PEG 20M (a polyethylene glycol having a molecular weight of 20,000). |
| F | 100 parts Orgasol 3501, 5 parts Tamol 731, 25 parts Michel Prime 4983 and 20 parts PEG 20M (an ethylene glycol oligomer having a molecular weight of 200). |
| G | 100 parts Orgasol 3501, 5 parts Tamol 731, 25 parts Sancor 12676 (Sancor 12676 is a heat sealable polyurethane). |

EXAMPLE 15

Image Receiving Layer Formulation 5

| Compound | Parts |
|---|---|
| PVOH Solution (5% Airvol 125 in water solution, Airproducts Inc., Allentown, PA) | 70 |
| Amine polymer (Kymene 450, Hercules Inc., Wilmington, DE) | 15 |
| Thermoplastic Polymer (Picotex LC-55WK, Hercules Inc., Wilmington, DE) | 9 |
| Thermoplastic Elastomer (Hystretch V-29, B. F. Goodrich, Cleveland, OH) | 5 |
| Antioxidant (Irganox 1076, Ciba Specialty Chemicals, Tarrytown, KY). | 1 |

EXAMPLE 16

A heat-setting label sheet of the present invention is prepared as follows:

Pressure Sensitive Adhesive Layer Formulation 1 is prepared as described in Example 1 and is coated onto a silicone coated release base to a thickness of 0.4 mils (wet).

After the Pressure Sensitive Adhesive Layer dries, the Adhesion Layer of Example 6 is coated on top of the Pressure Sensitive Adhesive Layer to a thickness of 3 mils (wet).

After the Adhesion Layer dries, Opaque Layer A as described in Example 7 is coated on top of the Pressure Sensitive Adhesive Layer to a thickness of 1.5 Mils (wet).

After Opaque Layer A dries, Opaque Layer B of Example 8 is coated Unstop of Opaque Layer A to a thickness of 1.5 mils (wet).

After Opaque layer B dries, Image Receiving Layer Formulation 1 as described in Example 9 i8 coated onto Opaque Layer B to a thickness of 1.0 mil (wet).

After the Image Receiving Layer dries, the heat-setting label sheet is imaged using an ink jet printer and transferred.

EXAMPLE 17

The heat-setting label sheet of Example 16 is transferred as follows:

The heat-setting label sheet is imaged using an ink jet printer. The Adhesion Layer, Opaque Layers, and the Image Receiving Layers (the label portion) are peeled away from the base and placed on a tee shirt Adhesion Layer down. Part of the Pressure Sensitive Adhesive Layer remains connected to the Adhesion Layer and helps to provide some tackiness that holds the label portion adhered to the substrate.

A hand iron on a high setting is used to apply heat to the label portion, which activates the heat-setting material and permanently adheres the label to the tee shirt. Typical pressure applied during ironing is applied to the label for a period of three minutes. Finally, the hand iron is removed from the tee shirt.

All cited patents, publications, copending applications, and provisional applications referred to in this application are herein incorporated by reference.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method of applying an image to a receptor element which comprises the steps of:
   (i) imaging a heat-setting label sheet, wherein said heat-setting label sheet comprises:
      (a) a support;
         a pressure sensitive adhesive layer comprising at least one of a polyester, acrylic polymer, or copolymer blend, said polyester, acrylic polymer, or copolymer blend having a glass transition temperature (Tg) of less than 0° C.; and
         an Adhesion Layer comprising a thermoplastic polymer which melts in the range of 50–250° C., a wax which melts in the range of 50–250° C., or combinations thereof;
         wherein said pressure sensitive adhesive layer is on the support and said Adhesion Layer is on the pressure sensitive adhesive layer; or
      (b) a support;
         a barrier layer coated on the support, said barrier layer comprising (1) a vinyl acetate with a Tg in the range of –10° C. to 100° C.; (2) a thermoplastic polymer having essentially no tack at transfer temperatures, a solubility parameter of at least 19 (Mpa)$^{1/2}$, and a glass transition temperature of at least 0° C., or (3) thermosetting polymers, ultraviolet curing polymers, or combinations thereof; and an Adhesion Layer coated on the barrier layer and comprising a thermoplastic polymer which melts in the range of 50–250° C., a wax which melts in the range of 50–250° C., or combinations thereof; and
   (ii) peeling said image and Adhesion Layer from said support, wherein said peeling occurs without water, heat, or chemical aids;
   (iii) positioning the Adhesion Layer against said receptor element; and either
   (iv) applying heat to the Adhesion Layer by placing a sheet of paper or protective film in between the Adhesion Layer and heating device to protect the label from damage caused by the heating device during heating, or applying heat from the side of the receptor element that does not contain the image and Adhesion Layer.

2. The method of claim 1, wherein said imaging is provided by an electrostatic printer or copier.

3. The method of claim 1, wherein said imaging is provided by offset or screen printing.

4. The method of claim 1, wherein said imaging is provided by craft-type marking.

5. The method of claim 1, wherein said craft-type marking is selected from the group consisting of markers, crayons, paints or pens.

6. The method of claim 1, wherein said imaging is provided by ink jet printing.

7. The method of claim 1, wherein said heat-setting label sheet comprises an image receiving layer coated on the Adhesion Layer which comprises at least one polymer which is capable of receiving and retaining water base colorants, said image receiving layer either does not melt when heat is applied or melts at a temperature above the melting temperature of the Adhesion Layer.

8. The method of claim 1, wherein said heat is applied indirectly to the label.

9. The method of claim 1, wherein the heat-setting label sheet comprises:
   (i) a support;
   (ii) a pressure sensitive adhesive layer comprising at least one of a polyester, acrylic polymer, or copolymer blend, said polyester, acrylic polymer or copolymer blend having a glass transition temperature (Tg) of less than 0° C.;
   (iii) an Adhesion Layer comprising a thermoplastic polymer which melts in the range of 50–250° C., a wax which melts in the range of 50–250° C., or combinations thereof;
   (iv) an optional opaque layer comprising a styrenebutadiene latex, thermoplastic polymer, elastomer and optional pigment;
   (v) a second optional opaque layer comprising vinyl acetate-ethylene copolymer, thermoplastic elastomer, elastomer and optional pigment.

10. The method of claim 9, wherein the heat-setting label sheet further comprises (vi) an image receiving layer which comprises at least one polymer which is capable of receiving and retaining water base colorants, said image receiving layer either does not melt when heat is applied or melts at a temperature above the melting temperature of the Adhesion Layer.

11. The method of claim 10, wherein in the heat-setting label sheet, said image receiving layer does not melt below 200° C.

12. The method of claim 10, wherein in the heat-setting label sheet, said image receiving layer comprises polyvinyl alcohol, amine polymer, thermoplastic polymer, thermoplastic elastomer, and an antioxidant.

13. The method of claim 9, wherein in the heat-setting label sheet, said pressure sensitive adhesive layer comprises an acrylic polymer adhesive.

14. The method of claim 9, wherein in the heat-setting label sheet, said support is selected from the group consisting of a cellulosic nonwoven web and polyester film.

15. The method of claim 9, wherein in the heat-setting label sheet, said support is a silicone film.

16. The method of claim 9, wherein in the heat-setting label sheet, an adhesive is placed between the support and the Adhesion Layer.

17. The method of claim 9, wherein the heat-setting label sheet, the Adhesion Layer comprises a thermoplastic polymer which melts in a range of from about 65° C. to about 180° C. and has a solubility parameter at least about 19 $(Mpa)^{1/2}$.

18. The method of claim 10, wherein in the heat-setting label sheet, said image receiving layer further comprises an oxidized polyethylene homopolymer.

19. The method of claim 10, wherein in the heat-setting label sheet, said image receiving layer further comprises an ethylene vinyl acetate copolymer powder.

20. The method of claim 9, wherein in the heat-setting label sheet, the Adhesion Layer comprises a polymeric composition comprising: an acrylic dispersion, an elastomeric emulsion, a water repellent and a plasticizer.

21. The method of claim 9, wherein in the heat-setting label sheet, the Adhesion Layer comprises a polymeric composition comprising a film forming binder, an elastomeric emulsion, a water repellent and a plasticizer.

22. The method of claim 20, wherein in the heat-setting label sheet, said acrylic dispersion is an ethylene acrylic acid dispersion, said water repellent is a polyurethane dispersion and said plasticizer is a polyethylene glycol.

23. The method of claim 22, wherein in the heat-setting label sheet, said ethylene acrylic acid dispersion melts in the range of from about 65° C. to about 180° C.

24. The method of claim 21, wherein in the heat-setting label sheet, said elastomeric emulsion has a Tg in the range of from −50° C. to 25° C.

25. The method of claim 22, wherein in the heat-setting label sheet, said polyurethane dispersion has a Tg in the range of from −50° C. to 25° C.

26. The method of claim 22, wherein in the heat-setting label sheet, said ethylene acrylic acid dispersion is present in an amount of from 46 to 90 parts by weight; said elastomeric emulsion is present in an amount of from 1 to 45 parts by weight; said polyurethane dispersion is present in an amount of from 1 to 7 parts by weight; and said polyethylene glycol is present in an amount of from 1 to 8 parts by weight.

27. The method of claim 22, wherein in the heat-setting label sheet, said ethylene acrylic acid dispersion is present in an amount of 86 parts by weight; said elastomeric emulsion is present in an amount of 5 parts by weight; said polyurethane dispersion is present in an amount of 4 parts by weight; and said polyethylene glycol is present in an amount of 4 parts by weight.

28. The method of claim 21, wherein the heat-setting label sheet further comprises a polyethylene glycol mono ((tetramethyl butyl)phenol)ester compound.

29. The method of claim 21, wherein in the heat-setting label sheet, the elastomeric emulsion is selected from the group consisting of polybutadiene, polybutadiene derivatives, polyurethane, polyurethane derivatives, styrene-butadiene, styrene-butadiene-styrene, acrylonitrile-butadiene, acrylonitrile-butadiene-styrene, acrylonitrile-ethylene-styrene, polyacrylates, polychloroprene, ethylene-vinyl acetate and poly(vinyl chloride).

30. The method of claim 21, wherein in the heat-setting label sheet, the film-forming binder is an acrylic dispersion.

31. The method of claim 21, wherein in the heat-setting label sheet, said film-forming binder is an acrylic dispersion, said water repellent is polyurethane dispersion and said plasticizer is a polyethylene glycol.

32. The method of claim 22, wherein in the heat-setting label sheet, said acrylic dispersion is an ethylene acrylic acid dispersion.

33. The method of claim 21, wherein in the heat-setting label sheet, the film-forming binder melts in the range of from about 65° C. to about 180° C.; said elastomeric emulsion has a Tg in the range of from −50° C. to 25° C.; and said polyurethane dispersion has a Tg in the range of from −50° C. to 25° C.

34. The method of claim 21, wherein the heat-setting label sheet further comprises a polyethylene glycol.

35. The method of claim 21, wherein in the heat-setting label sheet, the film-forming binder is present in an amount of from about 46 to about 90 percent by weight; said elastomeric emulsion is present in an amount of from 1 to about 45 percent by weight; said polyurethane dispersion is present in an amount of from about 1 to about 8 percent; and said Adhesion Layer further comprises polyethylene glycol in an amount of from 1 to about 8 percent by weight.

36. The method of claim 10, wherein in the heat-setting label sheet, the image receiving layer comprises an ethylene acrylic acid copolymer dispersion.

37. The method of claim 12, wherein in the heat-setting label sheet, said film-forming binder is present in an amount of 86 percent by weight; said elastomeric emulsion is present in an amount of 5 percent by weight; said polyurethane dispersion is present in an amount of 4 percent; and said polyethylene glycol is present in an amount of 4 percent by weight.

38. The method of claim 37, wherein in the heat-setting label sheet, said polyethylene glycol comprises a polyethylene glycol mono((tetramethyl butyl)phenol)ester compound.

39. The method of claim 21, wherein in the heat-setting label sheet, said elastomeric emulsion is selected from the group consisting of polybutadiene, polybutadiene derivatives, polyurethane, polyurethane derivatives, styrene-butadiene, styrene-butadiene-styrene, acrylonitrile-butadiene, acrylonitrile-butadiene-styrene, acrylonitrile-ethylene-styrene, polyacrylates, polychloroprene, ethylene-vinyl acetate and poly(vinyl chloride).

40. The method of claim 9, wherein in the heat-setting label sheet, said Adhesion Layer is present in a dry coat amount of from 5 to 30 $g/m^2$.

41. The method of claim 10, wherein in the heat-setting label sheet, said image receiving layer is present in a dry coat amount of from 1.0 to 40 $g/m^2$.

42. The method of claim 9, wherein in the heat-setting label sheet, the Adhesion Layer comprises a film-forming binder which melts in the range of from about 65° C. to about 180° C.; a wax dispersion; and a retention aid.

43. The method of claim 42, wherein in the heat-setting label sheet, the film-forming binder is selected from the group consisting of ethylene-acrylic acid copolymers, polyolefins, and waxes.

44. The method of claim 43, wherein in the heat-setting label sheet, the wax dispersion is selected from the group consisting of natural and synthetic waxes.

45. The method of claim 42, wherein in the heat-setting label sheet, the retention aid is selected from the group consisting of polyvinyl alcohols, polymer latexes and silicates.

46. The method of claim 9, wherein in the heat-setting label sheet, the Adhesion Layer has a melting point of at least 65° C. and comprises (i) particles of a thermoplastic polymer having dimensions of about 1 to about 50 micrometers, from about 10 to about 50 weight percent of a film-forming binder, based on the weight of the thermoplastic polymer, and optionally from about 0.2 to about 10 weight percent of a fluid viscosity modifier, based on the weight of the thermoplastic polymer, (ii) about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylenevinyl acetate copolymers, wherein each of said film-forming binder and said powdered thermoplastic polymer melts in the range of from about 65 C. to about 180 degrees Celsius and the powdered thermoplastic polymer consists of particles of about 1 to about 50 micrometers, (iii) a film forming binder selected from the group consisting of ethylene-acrylic acid copolymers having particles of about 1 to about 50 micrometers, polyolefins, and waxes and which melts in the range of from about 65° C. to about 180 degrees Celsius, (iv) a thermoplastic polymer having particles of about 1 to about 50 micrometers selected from the group consisting of polyolefins, polyesters, and ethylene-vinyl acetate copolymers and which melts in the range of from about 65 to about 180 degrees Celsius or, (v) a thermoplastic polymer having particles of about 1 to about 50 micrometers selected from the group consisting of polyolefins, polyesters, and ethylene-vinyl acetate copolymers, ethylene-methacrylic acid copolymers, and ethylene-acrylic acid copolymers and which melts in the range of from about 65 to about 180 degrees Celsius.

47. The method of claim 9, wherein in the heat-setting label sheet, the Adhesion Layer comprises particles of a thermoplastic polymer having dimensions of 1 to 20 micrometers.

48. The method of claim 9, wherein in the heat-setting label sheet, the Adhesion Layer comprises particles of a thermoplastic polymer having dimensions of about 1 to about 20 micrometers, from about 10 to about 50 weight percent of a film-forming binder, based on the weight of the thermoplastic polymer, and optionally from about 0.2 to about 10 weight percent of a fluid viscosity modifier, based on the weight of the thermoplastic polymer.

49. The method of claim 9, wherein in the heat-setting label sheet, the Adhesion Layer melts from about 65 to about 180 degrees Celsius and comprises particles of a thermoplastic polymer having dimensions of about 1 to about 20 micrometers, from about 10 to about 50 weight percent of a film-forming binder, based on the weight of the thermoplastic polymer, and from about 2 to about 20 weight percent of a cationic polymer, based on the weight of the thermoplastic polymer.

50. The method of claim 9, wherein in the heat-setting label sheet, the Adhesion Layer comprises from about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts in the range of from about 65 to about 180 degrees Celsius and said powdered thermoplastic comprises particles which are from about 1 to about 50 micrometers in diameter.

51. The method of claim 9, wherein in the heat-setting label sheet, the Adhesion Layer comprises a film forming binder selected from the group consisting of ethylene-acrylic acid copolymers having particles of about 1 to 20 micrometers, polyolefins, and waxes and which melts in the range of from about 65 to about 180 degrees Celsius.

52. The method of claim 9, wherein in the heat-setting label sheet, the Adhesion Layer comprises a thermoplastic polymer having particles of about 1 to 20 micrometers selected from the group consisting of polyolefins, polyesters, and ethylene-vinyl acetate copolymers and which melts in the range of from about to about 180 degrees Celsius.

53. The method of claim 9, wherein in the heat-setting label sheet, the Adhesion Layer comprises a thermoplastic polymer having particles of about 1 to 50 micrometers selected from the group consisting of polyolefins, polyesters, and ethylene-vinyl acetate copolymers, ethylene-methacrylic acid copolymers, and ethylene-acrylic acid copolymers and which melts in the range of from about 65 to about 180 degrees Celsius.

54. A method of applying an image to a receptor element which comprises the steps of:
(i) imaging a heat-setting label sheet, wherein said heat-setting label sheet comprises:
  (a) a support;
    a pressure sensitive adhesive layer comprising at least one of a polyester, acrylic polymer, or copolymer blend, said polyester, acrylic polymer, or copolymer blend having a glass transition temperature (Tg) of less than 0° C.; and
    an Adhesion Layer comprising a thermoplastic polymer which melts in the range of 50–250° C., a wax which melts in the range of 50–250° C., or combinations thereof;
    wherein said pressure sensitive adhesive layer is on the support and said Adhesion Layer is on the pressure sensitive adhesive layer; or
  (b) a support;
    a barrier layer coated on the support, said barrier layer comprising (1) a vinyl acetate with a Tg in the range of −10° C. to 100° C.; (2) a thermoplastic polymer having essentially no tack at transfer temperatures, a solubility parameter of at least 19 $(Mpa)^{1/2}$, and a glass transition temperature of at least 0° C., or (3) thermosetting polymers, ultraviolet curing polymers, or combinations thereof; and an Adhesion Layer coated on the barrier layer and comprising a thermoplastic polymer which melts in the range of 50–250° C., a wax which melts in the range of 50–250° C., or combinations thereof; and
(ii) peeling said image and Adhesion Layer from said support, wherein said peeling occurs without water, heat, or chemical aids;
(iii) positioning the Adhesion Layer against said receptor element; and
(iv) applying heat to the Adhesion Layer,
wherein said heat-setting label sheet further comprises an opaque layer positioned on the Adhesion Layer, wherein said opaque layer comprises a styrene-butadiene latex, optional pigment, thermoplastic polymer, and elastomer.

55. The method of claim 54, wherein said heat-setting label sheet comprises a second opaque layer comprising vinyl acetate-ethylene copolymer, optional pigment, thermoplastic polymer and elastomer, wherein said second opaque layer is coated on the opaque layer.

56. The method of claim 54, wherein said heat-setting label sheet comprises an image receiving layer coated on an opaque layer which comprises at least one polymer which is capable of receiving and retaining water base colorants, said image receiving layer either does not melt when heat is applied or melts at a temperature above the melting temperature of the Adhesion Layer.

57. The method of claim 55, wherein said heat-setting label sheet comprises an image receiving layer coated on said second opaque layer which comprises at least one polymer which is capable of receiving and retaining water base colorants, said image receiving layer either does not melt when heat is applied or melts at a temperature above the melting temperature of the Adhesion Layer.

58. The method of claim 1, wherein in said heat-setting label sheet, said Adhesion Layer is present in a dry coat amount of from 5 to 100 g/m$^2$.

59. A method of applying an image to a receptor element which comprises the steps of:
(i) imaging a heat-setting label sheet, wherein said heat-setting label sheet comprises:
a support;
a pressure sensitive adhesive layer comprising at least one of a polyester, acrylic polymer, or copolymer blend, said polyester, acrylic polymer, or copolymer blend having a glass transition temperature (Tg) of less than 0° C.; and
an Adhesion Layer comprising a thermoplastic polymer which melts in the range of 50–250° C., a wax which melts in the range of 50–250° C., or combinations thereof;
wherein said pressure sensitive adhesive layer is on the support and said Adhesion Layer is on the pressure sensitive adhesive layer;
(ii) peeling said image and Adhesion Layer from said support, wherein said peeling occurs without water, heat, or chemical aids;
(iii) positioning the Adhesion Layer against said receptor element; and
(iv) applying heat to the Adhesion Layer by placing a sheet of paper or protective film in between the Adhesion Layer and heating device to protect the upper layers of the label from damage caused by the heating device during heating or applying heat from the side of the receptor element that does not contain the image and Adhesion Layer.

60. A method of applying an image to a receptor element which comprises the steps of:
(i) imaging a heat-setting label sheet, wherein said heat-setting label sheet comprises:
a support;
a barrier layer coated on the support, said barrier layer comprising (1) a vinyl acetate with a Tg in the range of −10° C. to 100° C.; (2) a thermoplastic polymer having essentially no tack at transfer temperatures, a solubility parameter of at least 19 (Mpa)$^{1/2}$, and a glass transition temperature of at least 0° C., or (3) thermosetting polymers, ultraviolet curing polymers, or combinations thereof; and an Adhesion Layer coated on the barrier layer and comprising a thermoplastic polymer which melts in the range of 50–250° C., a wax which melts in the range of 50–250° C., or combinations thereof; and
(ii) peeling said image and Adhesion Layer from said support, wherein said peeling occurs without water, heat, or chemical aids;
(iii) positioning the Adhesion Layer against said receptor element; and
(iv) applying heat to the Adhesion Layer by placing a sheet of paper or protective film in between the Adhesion Layer and heating device to protect the label from damage caused by the heating device during heating, or applying heat from the side of the receptor element that does not contain the image and Adhesion Layer.

* * * * *